US011634170B2

(12) United States Patent
Shibata

(10) Patent No.: US 11,634,170 B2
(45) Date of Patent: Apr. 25, 2023

(54) ELECTRIC POWER-STEERING CONTROL DEVICE AND ELECTRONIC UNIT

(71) Applicant: DENSO CORPORATION, Kariya (JP)

(72) Inventor: Shinji Shibata, Kariya (JP)

(73) Assignee: DENSO CORPORATION, Kariya (JP)

( * ) Notice: Subject to any disclaimer, the term of this patent is extended or adjusted under 35 U.S.C. 154(b) by 771 days.

(21) Appl. No.: 16/597,120

(22) Filed: Oct. 9, 2019

(65) Prior Publication Data

US 2020/0039573 A1 Feb. 6, 2020

Related U.S. Application Data

(63) Continuation of application No. PCT/JP2018/014888, filed on Apr. 9, 2018.

(30) Foreign Application Priority Data

Apr. 11, 2017 (JP) ............................. JP2017-078158

(51) Int. Cl.

| | |
|---|---|
| ***B62D 5/04*** | (2006.01) |
| ***B60H 1/00*** | (2006.01) |
| ***B62D 1/06*** | (2006.01) |
| ***H01L 23/40*** | (2006.01) |
| ***H05K 7/20*** | (2006.01) |

(52) U.S. Cl.

CPC ......... *B62D 5/046* (2013.01); *B60H 1/00292* (2013.01); *B62D 1/065* (2013.01); *H01L 23/40* (2013.01); *H05K 7/2039* (2013.01)

(58) Field of Classification Search

CPC ......... B62D 1/065; B62D 5/046; H01L 23/40; H05K 7/2039; B60H 1/00292

See application file for complete search history.

(56) References Cited

U.S. PATENT DOCUMENTS

| | | | | |
|---|---|---|---|---|
| 6,000,125 | A | 12/1999 | Kang | |
| 2010/0254093 | A1 | 10/2010 | Oota et al. | |
| 2011/0194247 | A1* | 8/2011 | Nakasaka | H01L 23/40 361/689 |
| 2012/0326292 | A1* | 12/2012 | Ohashi | H01L 23/3677 257/690 |
| 2015/0189733 | A1* | 7/2015 | Shibata | H05K 7/2039 361/705 |
| 2015/0189794 | A1* | 7/2015 | Tashima | H05K 7/20854 361/720 |

(Continued)

FOREIGN PATENT DOCUMENTS

| | | | | |
|---|---|---|---|---|
| CN | 108463883 A * | 8/2018 | B62D 5/0406 |
| JP | S58-112676 A | 5/1983 | |
| JP | S60-225452 A | 9/1985 | |

(Continued)

*Primary Examiner* — Jenna M Hopkins

(74) *Attorney, Agent, or Firm* — Maschoff Brennan

(57) ABSTRACT

An electric power-steering control device has a substrate, a heat-generating component, and a heat-storing body. The heat-generating component is disposed on one surface of the substrate and generates heat when activated. The heat-storing body is capable of storing the heat from the heat-generating components. The heat-storing body has a main body having a rectangular plate shape and disposed on the one surface of the substrate. The heat-storing body has a notch section or a recess section.

17 Claims, 10 Drawing Sheets

100

1

80

101

105

103

104

102

(56) References Cited

U.S. PATENT DOCUMENTS

2019/0355656 A1* 11/2019 Hayashi .................. H01L 23/12

FOREIGN PATENT DOCUMENTS

| | | | | | |
|---|---|---|---|---|---|
| JP | H09-113638 | A | | 2/1997 | |
| JP | H09-213851 | A | | 8/1997 | |
| JP | 2010-245174 | A | | 10/2010 | |
| JP | 2013-004953 | A | | 1/2013 | |
| JP | 2015123846 | A | * | 7/2015 | ........... B62D 5/0406 |
| JP | 2016197684 | A | * | 11/2016 | ........... B62D 5/0406 |
| JP | 2017-0123440 | A | | 7/2017 | |
| JP | 2017123439 | A | * | 7/2017 | ........... B62D 5/0406 |
| JP | 2017123440 | A | * | 7/2017 | ........... B62D 5/0406 |
| JP | 2018176943 | A | * | 11/2018 | ......... B60H 1/00292 |
| WO | WO-2018190289 | A1 | * | 10/2018 | ......... B60H 1/00292 |

* cited by examiner

ELECTRIC POWER-STEERING CONTROL DEVICE AND ELECTRONIC UNIT

CROSS REFERENCE TO RELATED APPLICATIONS

The present application is a continuation application of International Patent Application No. PCT/JP2018/014888 filed on Apr. 9, 2018, which designated the U.S. and claims the benefit of priority from Japanese Patent Application No. 2017-078158 filed on Apr. 11, 2017. The entire disclosures of all of the above applications are incorporated herein by reference.

TECHNICAL FIELD

The present disclosure relates to an electric power-steering control device and an electronic unit.

BACKGROUND

There is known an electric power-steering control device which controls a motor capable of outputting assistive torque to assist steering by a driver and in which a heat-storing body capable of storing heat from a heat-generating component is provided in the vicinity of the heat-generating component on a substrate. For example, an electric power-steering control device is provided with heat-generating components and heat-storing bodies on a surface of a substrate on one side to suppress increase in temperature of the heat-generating components and to suppress heat interference between the heat-generating components.

SUMMARY

An electric power-steering control device may have a substrate, a heat-generating component, and a heat-storing body. The heat-generating component may be disposed on one surface of the substrate and may generate heat during operation. The heat-storing body may store heat from the heat-generating component. The heat-storing body may have a main body having a rectangular plate shape and disposed on the one surface of the substrate. The heat-storing body may have a notch section or a recess section.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
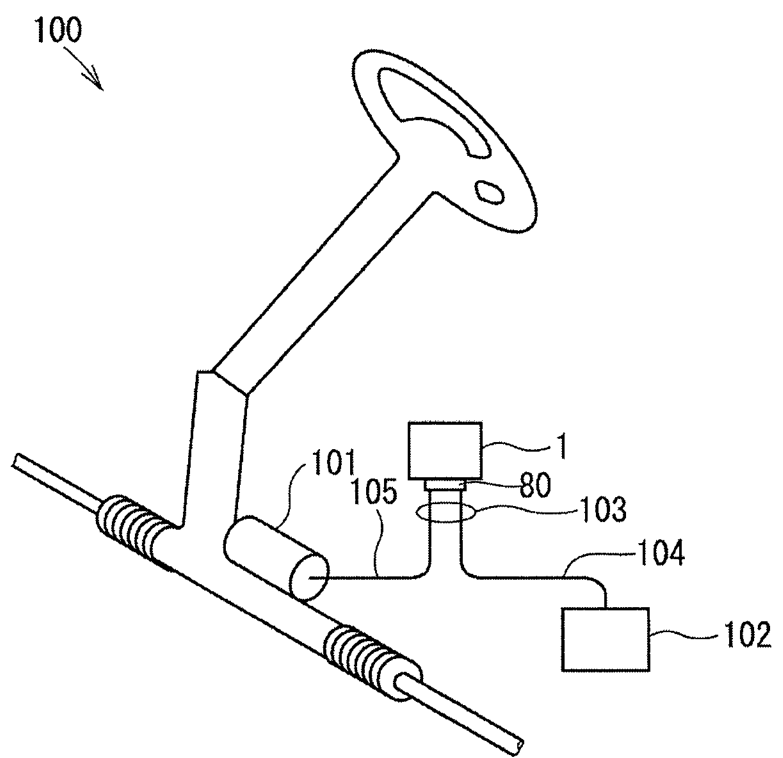
FIG. 1 is a schematic diagram showing an electric power-steering control device according to a first embodiment that is applied to an electric power-steering device.

In a case where a material having a relatively low hardness such as copper is punched by a press to form a heat-storing body having a plate shape, a shear droop may be formed in an outer edge on one surface of the heat-storing body, and the other surface may be formed into a planar shape. In such a case, a difference may be made between the front and back of the heat-storing body. If the heat-storing body is formed in a simple rectangular plate shape, it may be difficult to distinguish between the front and back of the heat-storing body at a glance.

In the case where the heat-storing body is mounted on a substrate with, for example, solder, there may arise a difference in a mounting state of the heat-storing body on the substrate between the front and back of the heat-storing body. For example, if the heat-storing body is mounted on the substrate with the surface, in which the shear droop is formed, facing the substrate, a gap may be generated between the portion of the shear droop of the heat-storing body and the substrate, and a contact area between the heat-storing body and the substrate may be thus made smaller. In this case, there may be a possibility that the gap between the shear droop and the substrate sucks solder and that a fillet is thus not formed sufficiently. As a result, there may be a possibility that it is difficult to check whether the heat-storing body is normally mounted on the substrate. In addition, there may be a possibility that the heat-storing body is displaced from a prescribed mount area and comes into contact with another component in the vicinity because the solder is sucked in the gap between the shear droop and the substrate.

The present disclosure provides an electric power-steering control device and an electronic unit in which it is possible to easily distinguish between the front and back of a heat-storing body and in which the mountability of a heat-storing body on a substrate is improved.

According to a first aspect of the present disclosure, an electric power-steering control device includes a control unit that controls a motor, which is capable of outputting assistive torque to assist steering by a driver. The electric power-steering control device includes a substrate, a heat-generating component, and a heat-storing body.

The heat-generating component is provided on one surface of the substrate and generates heat when operating.

The heat-storing body includes: a main body having a rectangular plate shape and provided on the surface of the substrate; and a notch section formed in a notch shape in an outer edge of the main body when viewed in a thickness direction of the substrate. The heat-storing body is configured to store heat from the heat-generating component. The heat-storing body can suppress an increase in temperature in the heat-generating component by storing the heat from the heat-generating component.

In the present disclosure, the heat-storing body has a linear asymmetric shape when viewed in the thickness direction of the substrate. For this reason, a worker or the like can easily distinguish between the front and back of the heat-storing body when placing the heat-storing body on the substrate. As a result, even when the heat-storing body has different shapes between the front and back, the mountability of the heat-storing body on the substrate can be improved.

According to a second aspect of the present disclosure, in an electric power-steering control device, a heat-storing body has a main body having a rectangular plate shape provided on one surface of a substrate; and a recess formed to be recessed from a surface opposite to the substrate, and the heat-storing body is configured to store heat from a heat-generating component. For this reason, a worker or the like can easily distinguish between the front and back of the heat-storing body when placing the heat-storing body on the substrate. As a result, even when the heat-storing body has different shapes between the front and back, the mountability of the heat-storing body on the substrate can be improved.

Since the mountability of the heat-storing body, which can suppress the increase in temperature in the heat-generating component, is high, the present disclosure is suitable for an electric power-steering control device in which a large current flows and a large amount of heat is generated.

Hereinafter, electric power-steering control devices according to a plurality of embodiments of the present disclosure will be described with reference to the drawings. In the embodiments, substantially the same constituent parts are given the same reference symbols, and the descriptions thereof will be omitted. In order to prevent the descriptions in the drawings from being complex, in some cases, a reference symbol may be assigned to only one of or a part of a plurality of substantially the same members or parts in one drawing.

First Embodiment

Figure 3:
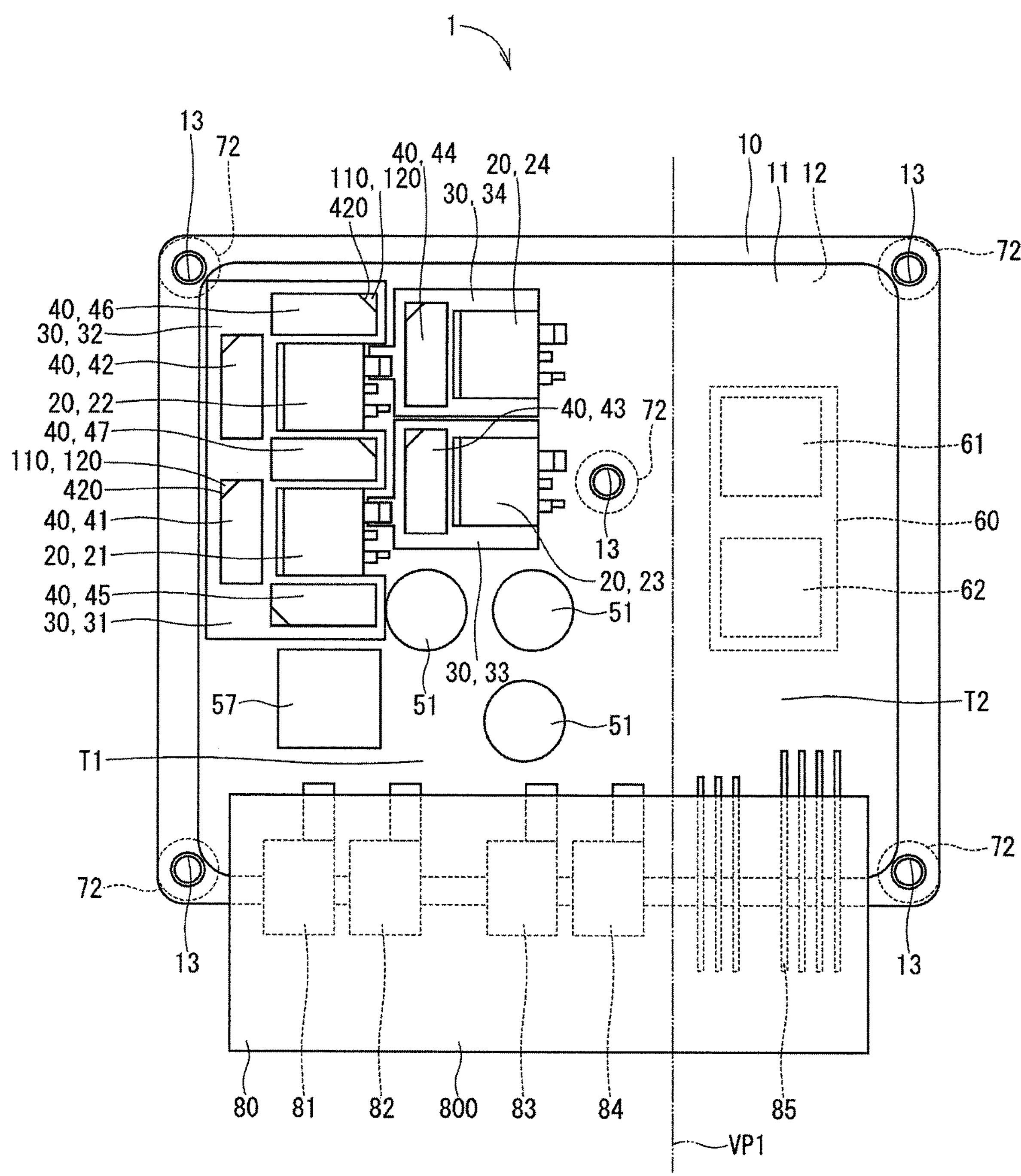
FIG. 3 is a plan view showing the electric power-steering control device according to the first embodiment.

FIG. 3 shows an electric power-steering control device according to a first embodiment of the present disclosure. As shown in FIG. 1, an electronic control unit 1 as an electric power-steering control device or an electronic unit is used for an electric power-steering device 100 on a vehicle and performs drive control of a motor 101 that generates assistive torque to assist steering by a driver, on the basis of a steering torque signal, a vehicle speed signal, and other signals.

Figure 4:
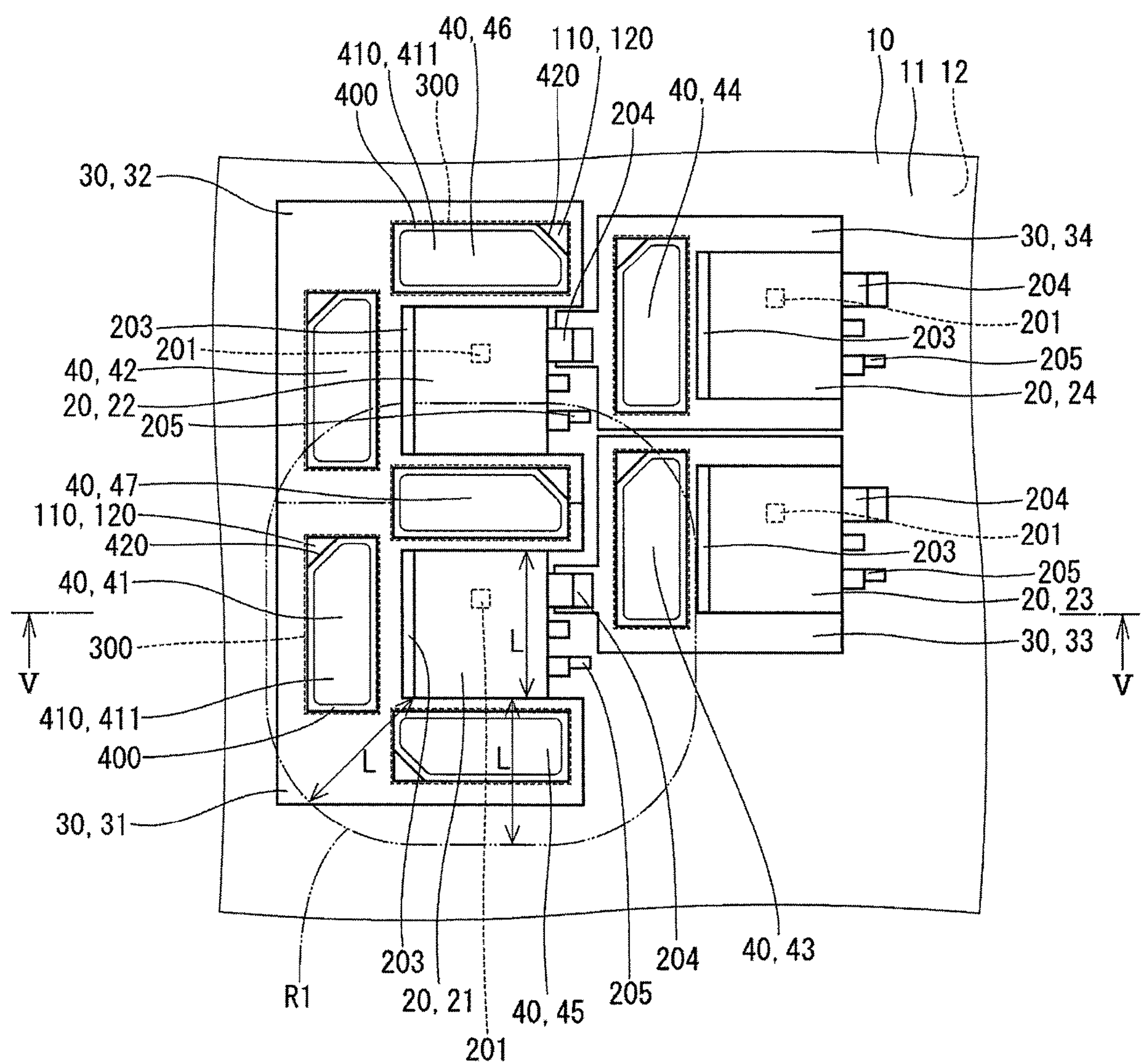
FIG. 4 is a schematic diagram showing the vicinity of heat-generating components of the electric power-steering control device according to the first embodiment.
Figure 5:
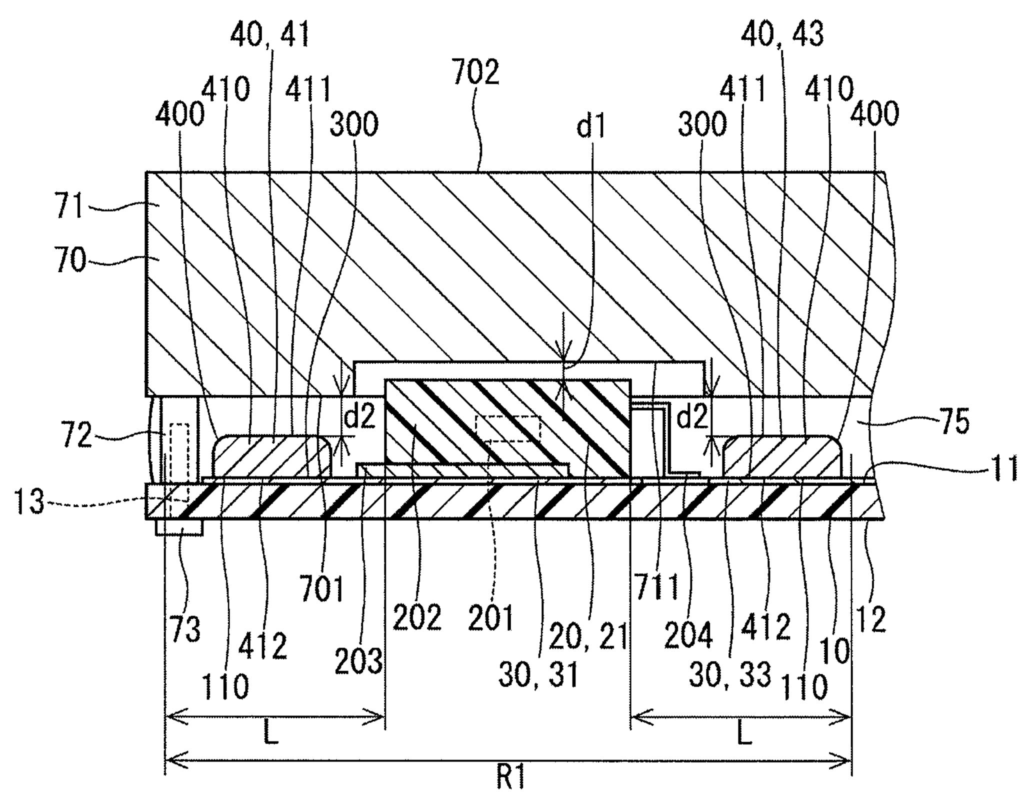
FIG. 5 is a cross-sectional view taken along line V-V of FIG. 4.

As shown in FIGS. 3 to 5, the electronic control unit 1 includes a substrate 10, semiconductor modules 20 as heat-generating components, heat-storing bodies 40, solder parts 110, capacitors 51 as electronic components, relays 55 and 56, a coil 57, a control unit 60, a heatsink 70 as a heat dissipation body, a heat conduction member 75, a connector 80, and the like.

The substrate 10 is a printed circuit board made of FR-4 or the like made of glass fiber and epoxy resin, for example. The substrate 10 is formed in an approximately rectangular shape.

In the present embodiment, each semiconductor module 20 is a semiconductor component including a semiconductor element such as a MOS-FET or an IGBT. As shown in FIGS. 3 to 5, the semiconductor modules 20 are each formed in, for example, a rectangular plate shape and are each mounted adjacent to one surface 11 of the substrate 10 such that planar directions of the semiconductor modules 20 are parallel to the surface of the substrate 10. Four of the semiconductor modules 20 (21 to 24) are provided in the present embodiment.

As shown in FIGS. 4 and 5, each semiconductor module 20 has a switching device 201, a sealing body 202, and terminals 203, 204, and 205.

The switching device 201 is a semiconductor element such as a MOS-FET or an IGBT. The switching device 201 generates heat when performing a switching operation.

The sealing body 202 is formed of an insulating material, such as resin, and covers the switching device 201. The sealing body 202 is formed in a rectangular plate shape, for example.

The terminal 203 is formed of an electrically conductive material, such as copper, in a rectangular plate shape. The terminal 203 is electrically connected to a drain of the switching device 201. The terminal 203 is provided on the sealing body 202 such that a surface of the terminal 203 opposite to the switching device 201 is exposed from the sealing body 202.

The terminal 204 is formed of an electrically conductive material such as copper. The terminal 204 is electrically connected to a source of the switching device 201. The terminal 204 is provided on the sealing body 202 such that an end of the terminal 204 opposite to the switching device 201 is exposed from the sealing body 202.

The terminal 205 is formed of an electrically conductive material such as copper. The terminal 205 is electrically connected to a gate of the switching device 201. The terminal 205 is provided on the sealing body 202 such that an end of the terminal 205 opposite to the switching device 201 is exposed from the sealing body 202.

The substrate 10 has printed wirings 30 as wirings. As shown in FIGS. 4 and 5, the printed wirings 30 are provided on the one surface 11 of the substrate 10. The printed wirings 30 are covered with a solder resist (not shown).

The printed wirings 30 are formed by printing a pattern made of an electrically conductive material such as copper on the surface of the substrate 10. The printed wirings 30 each have a thermal conductivity equal to or higher than a predetermined value, for example, about (300 K) 401 W/(m·K). Four of the printed wirings 30 (31 to 34) are provided in the present embodiment.

The printed wirings 31, 32, 33, and 34 are each formed in an approximately rectangular thin film shape and arranged to be adjacent to each other (see FIG. 4). The printed wiring 31 and the printed wiring 32 are integrally formed.

The semiconductor modules 21, 22, 23, and 24 are respectively provided corresponding to the printed wirings 31, 32, 33, and 34.

The semiconductor module 21 is provided such that a surface of the terminal 203 opposite to the switching device 201 faces or is in contact with the printed wiring 31. The terminal 203 of the semiconductor module 21 is soldered to the printed wiring 31. The terminal 204 of the semiconductor module 21 is soldered to the printed wiring 33.

The semiconductor module 22 is provided such that a surface of the terminal 203 opposite to the switching device 201 faces or is in contact with the printed wiring 32. The terminal 203 of the semiconductor module 22 is soldered to the printed wiring 32. The terminal 204 of the semiconductor module 22 is soldered to the printed wiring 34.

The semiconductor module 23 is provided such that a surface of the terminal 203 opposite to the switching device 201 faces or is in contact with the printed wiring 33. The terminal 203 of the semiconductor module 23 is soldered to the printed wiring 33.

The semiconductor module 24 is provided such that a surface of the terminal 203 opposite to the switching device 201 faces or is in contact with the printed wiring 34. The terminal 203 of the semiconductor module 24 is soldered to the printed wiring 34.

As shown in FIGS. 3 to 5, the heat-storing bodies 40 are provided adjacent to the one surface 11 of the substrate 10. Each heat-storing body 40 has a main body 410 and a notch section 420. The main body 410 is formed of an electrically conductive material, such as copper, in a rectangular plate shape. In other words, the main body 410 is formed in a hexahedral shape.

As shown in FIGS. 4 and 5, the main bodies 410 are provided on the substrate 10 such that a back surface 412 of each main body 410 faces the printed wiring 30 of the substrate 10. Therefore, a front surface 411 of each main body 410 is directed in the opposite direction to the substrate 10. The solder part 110 is provided between each heat-storing body 40 and the substrate 10. The solder parts 110 connect the back surfaces 412 of the main bodies 410 and the printed wirings 30 of the substrate 10 to each other. As described above, the heat-storing bodies 40 are soldered to the substrate 10.

The main bodies 410 each have a thermal conductivity equal to or higher than a predetermined value, for example, about (300K) 401 W/(m·K). The main bodies 410 each have a specific heat capacity of approximately $385\times10^2$ J/(kg·K), for example. In the present embodiment, the main bodies 410 are tin-nickel plated. This plating improves corrosion resistance and solderability of the main bodies 410.

As shown in FIG. 4, each notch section 420 is formed in a notch shape in an outer edge of each main body 410 when viewed in a thickness direction of the substrate 10. In the present embodiment, the notch section 420 is formed at one corner of the four corners of the main body 410 when viewed in the thickness direction of the substrate 10. In other words, the notch section 420 is formed such that one corner of the four corners of each of the front surface 411 and the back surface 412 of each main body 410 is cut off. The heat-storing bodies 40 are each formed in a linear asymmetric shape when viewed in the thickness direction of the substrate 10, in other words, are each formed in a shape other than a linear symmetric shape. In the present embodiment, the notch section 420 has a triangular shape when viewed in the thickness direction of the substrate 10.

In the present embodiment, seven heat-storing bodies 40 (41 to 47) are provided.

As shown in FIG. 4, the heat-storing bodies 41 to 47 have the same shape.

The heat-storing body 41 is provided on the side of the sealing body 202 of the semiconductor module 21 opposite to the terminals 204 and 205. The heat-storing body 41 is provided such that the longitudinal direction of the main body 410 is approximately parallel to a side of the sealing body 202 of the semiconductor module 21 and such that the heat-storing body 41 is away from the semiconductor module 21 by a predetermined distance. In this case, of the four corners of the main body 410 of the heat-storing body 41, the notch section 420 is formed in the corner furthest from the semiconductor module 21 when viewed in the thickness direction of the substrate 10.

The heat-storing body 42 is provided on the side of the sealing body 202 of the semiconductor module 22 opposite to the terminals 204 and 205. The heat-storing body 42 is provided such that the longitudinal direction of the main body 410 is approximately parallel to a side of the sealing body 202 of the semiconductor module 22 and such that the heat-storing body 42 is away from the semiconductor module 22 by a predetermined distance. In this case, of the four corners of the main body 410 of the heat-storing body 42, the notch section 420 is formed in the corner furthest from the semiconductor module 22 when viewed in the thickness direction of the substrate 10.

The heat-storing body 43 is provided on the side of the sealing body 202 of the semiconductor module 23 opposite to the terminals 204 and 205. The heat-storing body 43 is provided such that the longitudinal direction of the main body 410 is approximately parallel to a side of the sealing body 202 of the semiconductor module 23 and such that the heat-storing body 43 is away from the semiconductor module 23 by a predetermined distance. In this case, of the four corners of the main body 410 of the heat-storing body 43, the notch section 420 is formed in the corner furthest from the semiconductor module 23 when viewed in the thickness direction of the substrate 10.

The heat-storing body 44 is provided on the side of the sealing body 202 of the semiconductor module 24 opposite to the terminals 204 and 205. The heat-storing body 44 is provided such that the longitudinal direction of the main body 410 is approximately parallel to a side of the sealing body 202 of the semiconductor module 24 and such that the heat-storing body 44 is away from the semiconductor module 24 by a predetermined distance. In this case, of the four corners of the main body 410 of the heat-storing body 44, the notch section 420 is formed in the corner furthest from the semiconductor module 24 when viewed in the thickness direction of the substrate 10.

The heat-storing body 45 is provided on the side of the semiconductor module 21 opposite to the semiconductor module 22. The heat-storing body 45 is provided such that the longitudinal direction of the main body 410 is approximately parallel to a side of the sealing body 202 of the semiconductor module 21 and such that the heat-storing body 45 is away from the semiconductor module 21 by a predetermined distance. In this case, of the four corners of the main body 410 of the heat-storing body 45, the notch section 420 is formed in the corner furthest from the semiconductor module 21 when viewed in the thickness direction of the substrate 10.

The heat-storing body 46 is provided on the side of the semiconductor module 22 opposite to the semiconductor module 21. The heat-storing body 46 is provided such that the longitudinal direction of the main body 410 is approximately parallel to a side of the sealing body 202 of the semiconductor module 22 and such that the heat-storing body 46 is away from the semiconductor module 22 by a predetermined distance. In this case, of the four corners of the main body 410 of the heat-storing body 46, the notch section 420 is formed in the corner furthest from the semiconductor module 22 when viewed in the thickness direction of the substrate 10.

The heat-storing body 47 is provided between the semiconductor module 21 and the semiconductor module 22. The heat-storing body 47 is provided such that the longitudinal direction of the main body 410 is approximately parallel to sides of the sealing bodies 202 of the semiconductor modules 21 and 22 and such that the heat-storing body 47 is away from the semiconductor modules 21 and 22 by a predetermined distance. In this case, of the four corners of the main body 410 of the heat-storing body 47, the notch section 420 is formed in the corner furthest from the semiconductor module 21 when viewed in the thickness direction of the substrate 10. In the present embodiment, the distance between the main body 410 of the heat-storing body 47 and the semiconductor module 22 is equal to the distance between the main body 410 of the heat-storing body 47 and the semiconductor module 21.

The heat-storing bodies 47, 43, and 44 are respectively provided between the semiconductor module 21 and the semiconductor module 22, between the semiconductor module 21 and the semiconductor module 23, and between the semiconductor module 22 and semiconductor module 24. That is, the heat-storing bodies 40 are provided such that at least a part of the heat-storing bodies 40 is located between the semiconductor modules 20.

The heat-storing bodies 41, 45, and 47 are provided to surround the semiconductor module 21. The heat-storing bodies 42, 46, and 47 are provided to surround the semiconductor module 22. In other words, the heat-storing bodies 40 are provided such that at least a part of the heat-storing bodies 40 surrounds the semiconductor module 20.

As shown in FIG. 4, assumed that the length of the side, in the longitudinal direction, of the sealing body 202 of each semiconductor module 20 is L, the heat-storing bodies 41, 45, and 47 are provided within the boundary R1 that is away from the outer edges of the sealing body 202 of the semiconductor module 21 by a predetermined distance L. In the same way, the heat-storing bodies 42, 46, and 47 are provided within a boundary R1 that is away from the outer edges of the sealing body 202 of the semiconductor module 22 by a predetermined distance L. In the same way, the heat-storing body 43 is provided within a boundary R1 that is away from the outer edges of the sealing body 202 of the semiconductor module 23 by a predetermined distance L. In the same way, the heat-storing body 44 is provided within a boundary R1 that is away from the outer edges of the sealing body 202 of the semiconductor module 24 by a predetermined distance L.

In the present embodiment, regarding each of the heat-storing bodies 41 to 47, the length, in the longitudinal direction, of the main body 410 is longer than the length L of the side, in the longitudinal direction, of the sealing body 202 of the semiconductor module 20.

As described above, the heat-storing bodies 40 are each provided in the vicinities of the semiconductor modules 20. Therefore, the heat generated when the semiconductor modules 20 operate is conducted to the heat-storing bodies 40. The heat-storing bodies 40 can store the heat from the semiconductor modules 20.

As shown in FIG. 4, the switching device 201 of the semiconductor module 21 is located on a side adjacent to the terminal 204 with respect to the center of the sealing body 202, in other words, is located adjacent to the heat-storing body 47. The switching device 201 of the semiconductor module 22 is located on a side adjacent to the terminal 204 with respect to the center of the sealing body 202, in other words, is located adjacent to the heat-storing body 46. The switching device 201 of the semiconductor module 23 is located on a side adjacent to the terminal 204 with respect to the center of the sealing body 202. The switching device 201 of the semiconductor module 24 is located on a side adjacent to the terminal 204 with respect to the center of the sealing body 202. When the semiconductor modules 20 are operating, particularly, the temperatures of the switching devices 201 and the temperatures in the vicinities of the switching devices 201 increase.

As mentioned above, in the present embodiment, the notch section 420 is formed in the corner of the four corners of each main body 410, the corner being located furthest from the semiconductor module 20 when viewed in the thickness direction of the substrate 10. For this reason, it is possible to suppress the decrease in heat conduction performance from the semiconductor modules 20 to the heat-storing bodies 40. With respect to the semiconductor module 21, the notch section 420 of the heat-storing body 47 is formed in the corner of the four corners of the main body 410, the corner being located furthest from the semiconductor module 21; however, with respect to the semiconductor module 22, the notch section 420 of the heat-storing body 47 is formed in the corner of the four corners of the main body 410, the corner being located closest to the semiconductor module 22. However, the switching device 201 of the semiconductor module 21 is located on the side adjacent to the heat-storing body 47 in the sealing body 202, and the switching device 201 of the semiconductor module 22 is located on the side adjacent to the heat-storing body 46 in the sealing body 202. For this reason, it is possible to make the heat conduction performance from the semiconductor module 21 to the heat-storing body 47 and the heat conduction performance from the semiconductor module 22 to the heat-storing body 47 equal to each other.

As shown in FIG. 4, the mount areas 300 are each set at the position on the printed wiring 30, the position corresponding to each heat-storing body 40. Each mount area 300 corresponds to the portion of each printed wiring 30, the portion being exposed from the solder resist. In the present embodiment, each mount area 300 is formed in a rectangular shape to correspond to the shape of the main body 410 of each heat-storing body 40.

For example, the heat-storing bodies 40 are placed on the solder parts 110 (solder paste) provided on the mount areas 300, and the solder parts 110 are then melted, so that the heat-storing bodies 40 are integrated to the substrate 10. At this time, the molten solder parts 110 flow to the portions of the mount areas 300, the portions corresponding to the notch sections 420 of the heat-storing bodies 40 and make fillets 120. At this time, a worker or the like can easily confirm that each heat-storing body 40 is normally mounted on the substrate 10 by seeing the fillet 120 formed on the portion of the mount area 300, the portion corresponding to the notch section 420 of each heat-storing body 40.

Figure 6A:
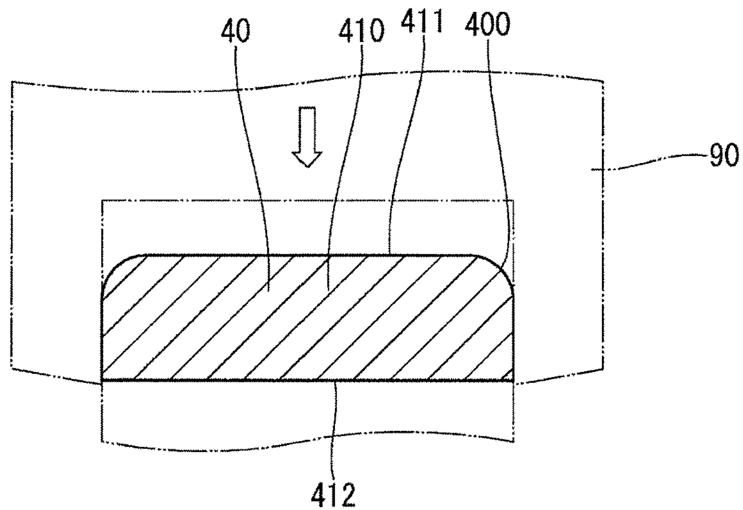
FIG. 6A is a cross-sectional view showing a heat-storing body of the electric power-steering control device according to the first embodiment.

As shown in FIG. 6A, in the present embodiment, the heat-storing body 40 is formed by punching a copper plate with a punching die 90. In this case, since the heat-storing body 40 is formed by pressing the punching die 90 against one surface of the plate, in other words, by punching by a press, a shear droop 400 is formed in the outer edge of the one surface. In the present embodiment, of the both surfaces of the main body 410 having a plate shape, the surface in which the shear droop 400 is formed is the front surface 411, and the surface on the opposite side is the back surface 412. Thus, the outer edge of the front surface 411 is formed in a curved surface. The back surface 412 of the main body 410 is formed in a planar shape.

Figure 6B:
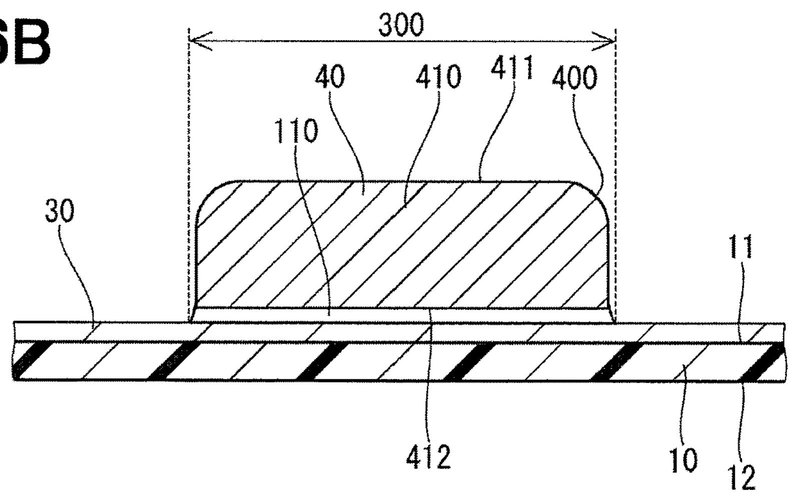
FIG. 6B is a cross-sectional view showing the heat-storing body correctly mounted on a substrate.

In the present embodiment, since the back surface 412 is formed in a planar shape, the heat-storing body 40 is mounted on the substrate 10 with the back surface 412 facing the substrate 10 as shown in FIG. 6B. In this case, the heat-storing body 40 can be mounted stably in the mount area 300. In this state, the main body 410 is formed such that the outer edges of the corners on the side of the main body 410 opposite to the substrate 10 have a curved line shape in the cross-section in the thickness direction of the substrate 10.

Figure 6C:
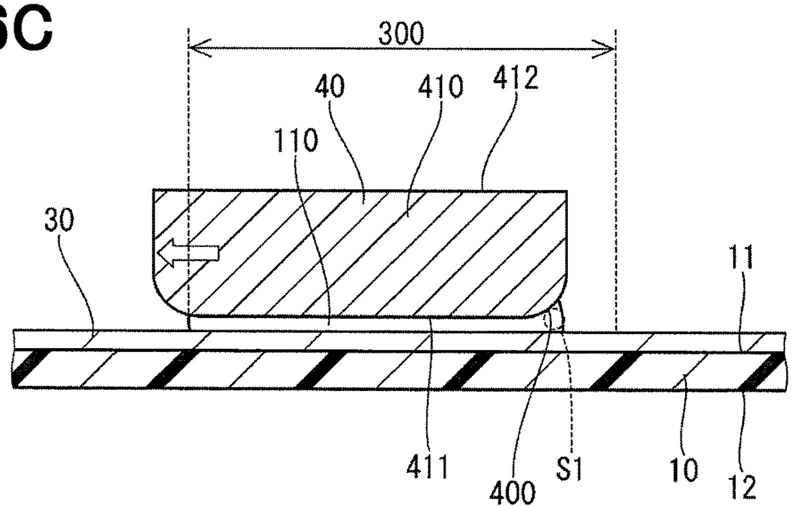
FIG. 6C is a cross-sectional view showing the heat-storing body incorrectly mounted on the substrate.

On the other hand, as shown in FIG. 6C, if the heat-storing body 40 is mounted on the substrate 10 with the front surface 411, in which the shear droop 400 is formed, facing the substrate 10, a gap S1 is generated between the portion of the shear droop 400 of the heat-storing body 40 and the substrate 10. In this case, there is a possibility that the heat-storing body 40 is displaced from the prescribed mount area 300 and comes into contact with another component in the vicinity because the solder part 110 is sucked in the gap S1 between the shear droop 400 and the substrate 10. In addition, since the solder part 110 is sucked into the gap S1 between the shear droop 400 and the substrate 10, there is a possibility that the fillet 120 is not formed sufficiently. As a result, there is a possibility that it is difficult to check whether the heat-storing body 40 is normally mounted on the substrate 10.

In the present embodiment, the heat-storing body 40 is formed in a linear asymmetric shape when viewed in the thickness direction of the substrate 10. For this reason, when the heat-storing body 40 is provided on the substrate 10, a worker or the like can easily distinguish between the front and back of the heat-storing body 40. As a result, it is easy to mount the heat-storing body 40 correctly on the substrate 10 with the back surface 412 in a planar shape facing the substrate 10.

In the case where the heat-storing body 40 is mounted on the substrate 10 such that the back surface 412 in a planar shape faces the substrate 10 as in the present embodiment, it is possible to suppress the above-described positional displacement of the heat-storing body 40 and insufficient formation of the fillet 120.

The capacitors 51 are, for example, aluminum electrolytic capacitors in the present embodiment. The capacitors 51 are each formed, for example, in an approximately columnar shape and are mounted adjacent to the one surface 11 of the substrate 10 such that the axis direction of each capacitor 51 is perpendicular to the face of the substrate 10 (see FIG. 3). Three capacitors 51 are provided in the present embodiment.

The relays 55 and 56 are each, for example, a mechanical relay configured mechanically in the present embodiment. The relays 55 and 56 are mounted adjacent to the other surface 12 of the substrate 10, for example.

The coil 57 is, for example, a choke coil in the present embodiment. The coil 57 is formed, for example, in a rectangular pillar shape and is mounted adjacent to the one surface 11 of the substrate 10 such that the height direction of the coil 57 is perpendicular to the face of the substrate 10 (see FIG. 3).

The control unit 60 has, for example, a microcomputer 61 and a custom integrated circuit (IC) 62. Each of the microcomputer 61 and the custom IC 62 is a semi-conductor package having, for example, a central processing unit (CPU), a read-only memory (ROM), a random-access memory (RAM), and an input/output interface (I/O). The control unit 60 controls operations of the relays 55 and 56 and the semiconductor modules 20 (21 to 24). The control unit 60 controls rotation drive of the motor 101 by controlling the operations of the semiconductor modules 20 on the basis of signals and the like from sensors and other devices provided on various parts of the vehicle.

The microcomputer 61 and the custom IC 62 are mounted adjacent to the other surface 12 of the substrate 10, as shown in FIG. 3.

Figure 2:
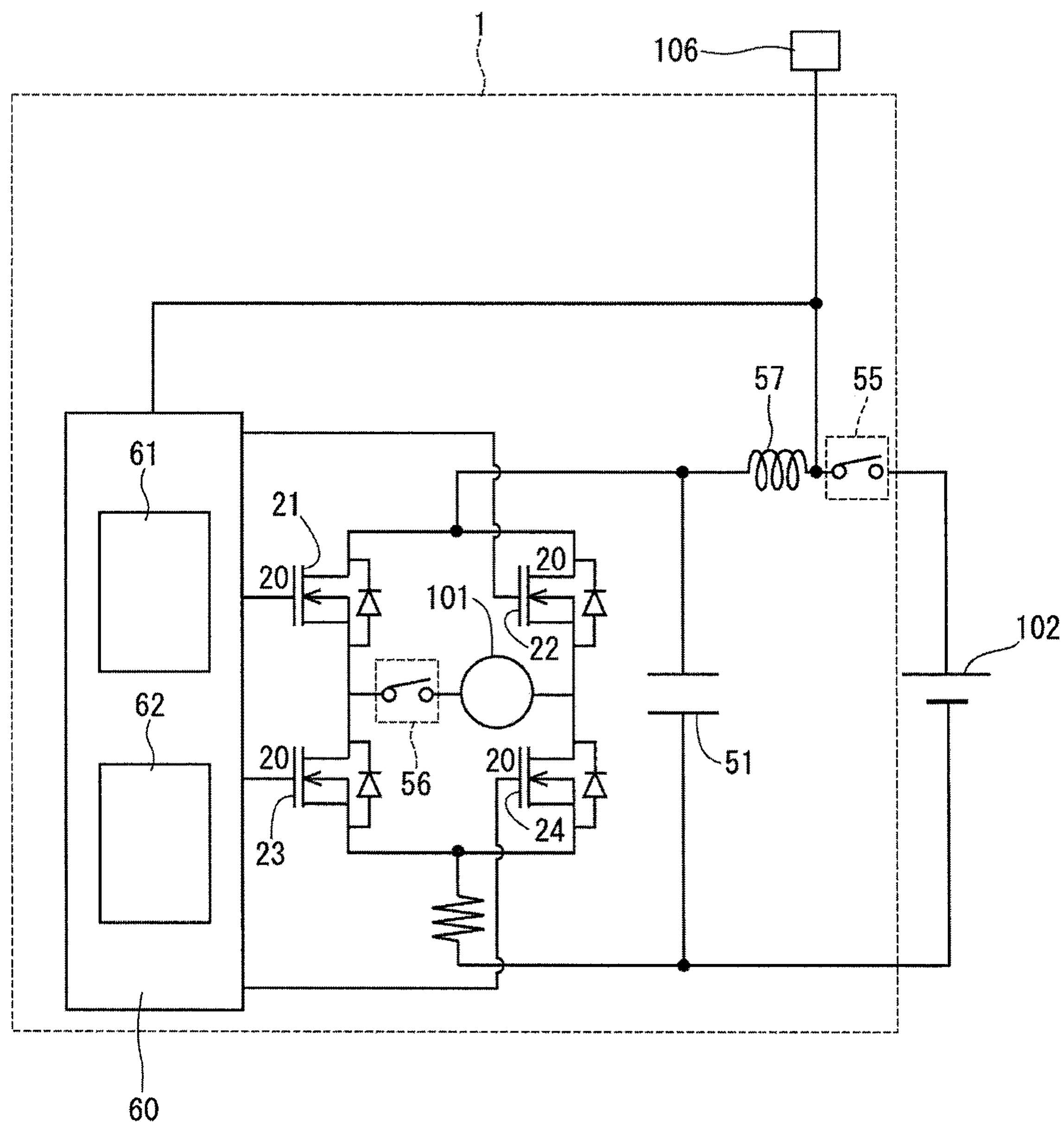
FIG. 2 is a diagram showing an electric configuration of the electric power-steering control device according to the first embodiment.

With reference to FIG. 2, a description will be given on electrical connections among the semiconductor modules 20, the capacitors 51, the relays 55 and 56, the coil 57, and the control unit 60.

A positive terminal of a battery 102, which is a power source of the vehicle, is connected to the relay 55. The relay 55 is controlled by the control unit 60 and turns on or turns off to allow or shut supply of electric power from the battery 102 to the electronic control unit 1. That is, the relay 55 is a power source relay in the present embodiment.

The electric power from the battery 102 is supplied to the semiconductor modules 20 (21 to 24) via the coil 57. The coil 57 reduces noise on the electric power supplied from the battery 102 to the motor 101 via the electronic control unit 1.

The ignition power source 106 of the vehicle is connected to a point between the relay 55 and the coil 57 and to the control unit 60. The control unit 60 (the microcomputer 61 and the custom IC 62) operates by electric power from the ignition power source 106.

As shown in FIG. 2, the semiconductor module 21 and the semiconductor module 23 are series-connected, and the semiconductor module 22 and the semiconductor module 24 are series-connected. A pair of the semiconductor modules 21 and 23 is parallel-connected to a pair of the semiconductor modules 22 and 24.

Between the connection point of the two semiconductor modules 21 and 23 and the connection point of the two semiconductor modules 22 and 24, the relay 56 and the motor 101 are disposed. The capacitors 51 are parallel-connected between a power source line and a ground. The capacitors 51 suppress a surge voltage generated by on-and-off operations (switching operations) of the semiconductor modules 20 (21 to 24).

With the above-described configuration, for example, when the semiconductor modules 21 and 24 turn on and the semiconductor modules 22 and 23 turn off, a current flows in the order of the semiconductor module 21, the relay 56, the motor 101, and the semiconductor module 24. In contrast, when the semiconductor modules 22 and 23 turn on and the semiconductor modules 21 and 24 turn off, a current flows in the order of the semiconductor module 22, the motor 101, the relay 56, and the semiconductor module 23. Since the motor 101 is a direct current motor, the motor 101 is rotation-driven by the semiconductor modules 20 (21 to 24) being controlled on and off. To the terminal 205 of each of the semiconductor modules 20 (21 to 24), a signal line from the control unit 60 (the custom IC 62) is connected. That is, the control unit 60 controls the rotation drive of the motor 101 by controlling the switching operations of the semiconductor modules 20.

The relay 56 is controlled by the control unit 60 and turns on or turns off to allow or shut supply of electric power from the battery 102 to the motor 101. That is, the relay 56 is a motor relay in the present embodiment.

When the semiconductor modules 20 are performing switching operations, a relatively large current flows through the semiconductor modules 20, the capacitors 51, the relays 55 and 56, and the coil 57; therefore, the switching devices 201 of the semiconductor modules 20, the capacitors 51, the relays 55 and 56, and the coil 57 generate heat, and the temperatures become relatively high. In this case, each semiconductor module 20 is a component that generates heat equal to or more than a predetermined value when operating.

The heatsink 70 is formed of metal such as aluminum. As shown in FIG. 5, the heatsink 70 has a heatsink main body 71, columnar parts 72, screws 73, and the like. The heatsink main body 71 is formed in, for example, a rectangular plate shape. The heatsink 70 is provided such that one surface 701 of the heatsink main body 71 faces the one surface 11 of the substrate 10.

The heatsink 70 has a specific heat capacity of approximately $900\times10^2$ J/(kg·K), for example. The heatsink 70 has a thermal conductivity of approximately (300 K) 237 W/(m·K), for example.

Between the one surface 701 of the heatsink main body 71 of the heatsink 70 and the one surface 11 of the substrate 10, there is formed a predetermined gap.

In the one surface 701 of the heatsink main body 71, there are formed specific recesses 711 each of which is a recess that is recessed toward the other surface 702, in other words, toward the opposite side to the substrate 10. The specific recesses 711 are each formed at the position corresponding to each semiconductor module 20. Each specific recess 711 is formed in a rectangular shape to correspond to the shape of the sealing body 202 of each semiconductor module 20. Each specific recess 711 is formed larger than each sealing body 202. Four specific recesses 711 are formed correspondingly to the semiconductor modules 21 to 24.

As shown in FIG. 5, in the present embodiment, a distance d1 between the sealing body 202 of each semiconductor module 20 and the corresponding specific recess 711 of the heatsink 70 is set equal to or less than a distance d2 between each of the heat-storing bodies 40 and the one surface 701 of the heatsink 70. In the present embodiment, d1 is set less than d2. For this reason, even if the heatsink 70 and the substrate 10 get closer to each other due to, for example, vibration, force from outside, or the like makes, contact between the heatsink 70 and the heat-storing bodies 40 is surely restricted because the sealing bodies 202 of the semiconductor modules 20 and the heatsink 70 come into contact with each other. As a result, it is possible to surely suppress positional displacement of the heat-storing bodies 40 with respect to the substrate 10 and to surely restrict coming off of the heat-storing bodies 40 from the substrate 10.

In addition, in the case where the heat-storing bodies 40 are formed of electrically conductive material and are electrically connected to the semiconductor modules 20 via the printed wirings 30 as in the present embodiment, if the heatsink 70 comes in contact with the heat-storing bodies 40, the heatsink 70 and the heat-storing bodies 40 will be short-circuited. However, in the present embodiment, since the above arrangement can restrict the contact between the heatsink 70 and the heat-storing bodies 40, the short circuit between the heatsink 70 and the heat-storing bodies 40 can also be restricted.

Each columnar part 72 is formed in an approximately columnar shape to extend from the heatsink main body 71 toward the substrate 10. In the present embodiment, each columnar part 72 is formed to correspond to each of predetermined parts including four corners of the substrate 10 (see FIG. 3).

The substrate 10 has screw holes 13 each corresponding to each of the predetermined parts including the four corners. Each screw 73 is inserted through the corresponding screw hole 13 and is screwed into each columnar part 72 of the heatsink 70. This arrangement makes the position of the substrate 10 stable with respect to the heatsink 70.

The heat conduction member 75 is, for example, heat dissipation grease in the present embodiment. The heat dissipation grease is a gelatinous member having a low heat resistance whose base material is, for example, silicone. The heat conduction member 75 is provided in contact with the substrate 10, the semiconductor modules 20, the printed wirings 30, the heat-storing bodies 40, and the heatsink 70 between the one surface 11 of the substrate 10 and the one surface 701 of the heatsink 70. This arrangement enables the heat conduction member 75 to conduct the heat from the semiconductor modules 20 and the heat-storing bodies 40 to the heatsink 70. Therefore, the heat from the semiconductor modules 20 and the heat-storing bodies 40 can be dissipated via the heat conduction member 75 and the heatsink 70.

In the present embodiment, since, the terminals 203 and 204 of the semiconductor module 20 and the heat-storing body 40 are connected to each other via the printed wiring 30, the heat from the switching device 201 of the semiconductor module 20 is rapidly conducted via the terminals 203 and 204 and the printed wiring 30 to the heat-storing body 40. Therefore, the heat from the semiconductor modules 20 can be rapidly dissipated via the printed wirings 30, the heat-storing bodies 40, the heat conduction member 75, and the heatsink 70.

As shown in FIG. 3, the connector 80 has a connector main body 800, power supply terminals 81 to 84, and signal terminals 85. The connector main body 800 is formed of, for example, resin in a rectangular cylindrical shape. The connector main body 800 is provided on the outer edge of the substrate 10.

The power supply terminals 81 to 84 and the signal terminals 85 are formed of electrically conductive material such as copper. The power supply terminals 81 to 84 and the signal terminal 85 are insert-molded in the connector main body 800.

The power supply terminal 81 is soldered to a printed wiring (not shown) on the substrate 10 and is electrically connected to the terminals 203 of the semiconductor modules 21 and 22, that is, is electrically connected to the printed wirings 31 and 32 via the relay 55 and the coil 57. The power supply terminal 82 is soldered to a printed wiring on the substrate 10 and is electrically connected to the terminals 204 of the semiconductor module 23 and 24.

The power supply terminal 83 is soldered to a printed wiring on the substrate 10 and is electrically connected to the terminal 204 of the semiconductor module 21 and the terminal 203 of the semiconductor module 23, that is, is electrically connected to the printed wiring 33. The power supply terminal 84 is soldered to a printed wiring on the substrate 10 and is electrically connected to the terminal 204 of the semiconductor module 22 and the terminal 203 of the semiconductor module 24, that is, is electrically connected to the printed wiring 34.

The signal terminals 85 are soldered to printed wirings on the substrate 10 and are electrically connected to the control unit 60 (the microcomputer 61 and the custom IC 62). Through the signal terminals 85, there flow the steering torque signal, the vehicle speed signal, and the like, which are signals for controlling the motor 101 via the control unit 60.

When the motor 101 operates (rotates), relatively large currents to be supplied to the motor 101 flows through the power supply terminals 81 to 84.

In the present embodiment, the heat-storing body 45 is provided between the semiconductor module 21 and the power supply terminals 81 and 82 of the connector 80.

As shown in FIG. 3, when the substrate 10 is separated into two areas T1 and T2 by a virtual plane VP1 perpendicular to the substrate 10, the semiconductor modules 20 and the power supply terminals 81 to 84 are provided in the area T1 on one side, and the control unit 60 (the microcomputer 61 and the custom IC 62) and the signal terminals 85 are provided in the area T2 on the other side.

To the connector 80, a harness 103 is to be connected (see FIG. 1). A conductive wire 104 of the harness 103 electrically connects the positive terminal of the battery 102 and the power supply terminal 81 of the connector 80 to each other. Conductive wires 105 of the harness 103 electrically connect terminals of wirings of the motor 101 and the power supply terminals 83 and 84 of the connector 80. That is, the power supply terminals 83 and 84 are motor terminals.

Next, an operation of the electronic control unit 1 of the present embodiment will be described.

When a driver of the vehicle turns on an ignition switch, electric power is supplied from the ignition power source 106 to the electronic control unit 1, and the electronic control unit 1 starts up. When the electronic control unit 1 has started up, the control unit 60 causes the relays 55 and 56 to turn on. This operation establishes a state where electric power is allowed to be supplied from the battery 102 to the motor 101.

While the ignition switch is on, the control unit 60 controls the rotation drive of the motor 101 by controlling the switching operations of the semiconductor modules 20 (21 to 24) on the basis of the steering torque signal, the vehicle speed signal, and the like. This control causes the motor 101 to output assistive torque, thereby assisting steering by the driver.

In the present embodiment, when the control unit 60 controls the rotation drive of the motor 101 by controlling the switching operations of the semiconductor modules 20 (21 to 24), a relatively large current flows through the semiconductor modules 20, the capacitors 51, the relays 55 and 56, and the coil 57; therefore, heat is generated by the semiconductor modules 20, the capacitors 51, the relays 55 and 56, and the coil 57, so that the temperatures become relatively high. Part of the heat of the semiconductor modules 20 is conducted to the heat-storing bodies 40 via the printed wirings 30 and/or the heat conduction member 75.

The heat of the semiconductor modules 20 (21 to 24) and the heat-storing bodies 40 is conducted to the heatsink 70 via the heat conduction member 75.

As described above, in the present embodiment, when the electronic control unit 1 is operating, the heat of the semiconductor modules 20 (21 to 24) and the heat-storing bodies 40 can be effectively conducted to the heatsink 70. As a result, the heat of the semiconductor modules 20 (21 to 24) and the heat-storing bodies 40, which are heat-generating components, can be effectively dissipated.

As described above, the present embodiment is directed to an electronic control unit 1 that includes a control unit 60 to control a motor 101 capable of outputting assistive torque to assist steering by a driver, and the electronic control unit 1 includes a substrate 10, a semiconductor module 20, and a heat-storing body 40.

The semiconductor module 20 is provided on one surface 11 of the substrate 10 and generates heat when operating.

The heat-storing body 40 includes: a main body 410 provided on the one surface 11 of the substrate 10 and having a rectangular plate shape; and a notch section 420 provided in an outer edge of the main body 410 and formed in a notch shape when viewed in a thickness direction of the substrate 10. The heat-storing body 40 is configured to store heat from the semiconductor module 20. Since the heat-storing body 40 stores the heat from the semiconductor module 20, it is possible to suppress a temperature rise of the semiconductor module 20.

In the present embodiment, the heat-storing body 40 is formed in a linear asymmetric shape when viewed in the thickness direction of the substrate 10. For this reason, when the heat-storing body 40 is provided on the substrate 10, a worker or the like can easily distinguish between the front and back of the heat-storing body 40. As a result, even if the heat-storing body 40 has different shapes between the front and back, it is possible to improve the mountability of the heat-storing body 40 on the substrate 10.

In the electronic control unit 1 of the present embodiment, since the mountability of the heat-storing bodies 40, which are capable of suppressing the temperature rise of the semiconductor modules 20, is high, the electronic control unit 1 is suitable as a control device for an electric power-steering device 100 in which a large current flows and thus generates a large amount of heat.

In the present embodiment, the notch section 420 is formed in one corner of the four corners of the main body 410 when viewed in the thickness direction of the substrate 10. For this reason, it is easy to form the heat-storing body 40 by press working or the like.

In addition, in the present embodiment, the notch section 420 is formed in the corner of the four corners of the main body 410, the corner being located furthest from the semiconductor module 20 when viewed in the thickness direction of the substrate 10. For this reason, it is possible to achieve the above object while suppressing the decrease in the heat conduction performance from the semiconductor module 20 to the heat-storing body 40.

In addition, the present embodiment further includes solder part 110 connecting the substrate 10 and the heat-storing body 40 to each other.

In the present embodiment, since the heat-storing body 40 is formed by punching by a press, a shear droop 400 is formed in the outer edge on one surface (front surface 411) of the heat-storing body 40. If the heat-storing body 40 is mounted on the substrate 10 such that the front surface 411, in which the shear droop 400 is formed, faces the substrate 10, a gap S1 is generated between the shear droop 400 of the heat-storing body 40 and the substrate 10, and a solder part 110 is sucked in the gap S1, so that the heat-storing body 40 may be displaced from a prescribed mount area 300 (see FIG. 6C) and may come into contact with another component in the vicinity. In addition, since the gap S1 between the shear droop 400 and the substrate 10 sucks the solder part 110, there is a possibility that a fillet 120 is not formed sufficiently and that it is thus difficult to check whether the heat-storing body 40 is normally mounted on the substrate 10.

As mentioned above, in the present embodiment, the heat-storing body 40 is formed in a linear asymmetric shape when viewed in the thickness direction of the substrate 10, and it is therefore possible to distinguish between the front and back of the heat-storing body 40. Therefore, it is easy to mount the heat-storing body 40 correctly on the substrate 10 with a back surface 412 in a planar shape facing the substrate 10.

In addition, as mentioned above, in the present embodiment, the notch section 420 is formed in the one corner of the four corners of the main body 410 when viewed in the thickness direction of the substrate 10. When the heat-storing body 40 is mounted with a solder part 110, a fillet 120 is formed on the portion of the mount area 300, the portion corresponding to the notch section 420 of the heat-storing body 40. By seeing the fillet 120, a worker or the like can confirm that a part of the heat-storing body 40, in particular, the portion in the vicinity of the notch section 420, in other words, the portion in the vicinity of the corner of the main body 410 is normally connected to the substrate 10.

In addition, as mentioned above, in the present embodiment, the notch section 420 is formed in the corner of the four corners of the main body 410, the corner being located furthest from the semiconductor module 20 when viewed in the thickness direction of the substrate 10. Therefore, when the heat-storing body 40 is mounted with a solder part 110, a worker or the like can easily see the fillet 120. As such, it is possible to perform checking a mounting state of the heat-storing body 40.

In the present embodiment, mount areas 300 each corresponding to the shape of each main body 410 are provided on the substrate 10. As mentioned above, in the present embodiment, when the heat-storing body 40 is mounted with a solder part 110, a fillet 120 is formed on the portion of the mount area 300, the portion corresponding to the notch section 420 of the heat-storing body 40. Therefore, it is possible to set a shape and size of the mount area 300 as small as the shape (rectangular shape) and size of the main body 410. This enables checking of a mounting state on the basis of the fillet 120 and, at the same time, enables high density mounting of heat-storing bodies 40, thereby contributing to downsizing of the electronic control unit 1. In addition, by setting the mount area 300 small, the distance between the heat-storing body 40 and the semiconductor module 20 can be small, and heat can be well conducted from the semiconductor module 20 to the heat-storing body 40. As a result, it is possible to improve cooling efficiency of the semiconductor module 20 by the heat-storing body 40.

In the present embodiment, the main body 410 is formed such that the outer edges of the corners on the side opposite to the substrate 10 have a curved line shape defined in the cross-section in the thickness direction of the substrate 10. In the present embodiment, since the heat-storing body 40 is formed by punching a plate by a press, the shear droop 400 is formed in the outer edge of one surface of the heat-storing body 40. In the present embodiment, since the heat-storing body 40 is provided on the substrate 10 such that the back surface 412 in a planar shape, in which no shear droop 400 is formed, faces the substrate 10, the outer edges of the corners on the side of the main body 410 opposite to the substrate 10 have a curved line shape in the cross-section in the thickness direction of the substrate 10. The present embodiment illustrates mounting, on the substrate 10, of a heat-storing body 40 having different shapes between the front and the back as the heat-storing body 40 formed by press working. In the case where the heat-storing body 40 is formed by press working, manufacturing costs can be reduced.

In addition, an electronic control unit 1 of the present embodiment includes a substrate 10, a semiconductor module 20, and a heat-storing body 40.

The semiconductor module 20 is provided on one surface 11 of the substrate 10 and generates heat when operating.

The heat-storing body 40 includes: a main body 410 provided on the one surface 11 of the substrate 10 and having a rectangular plate shape; and a notch section 420 provided in an outer edge of the main body 410 and formed in a notch shape when viewed in a thickness direction of the substrate 10. The heat-storing body 40 is configured to store heat from the semiconductor module 20. Since the heat-storing body 40 stores the heat from the semiconductor module 20, it is possible to suppress a temperature rise of the semiconductor module 20.

In the present embodiment, the heat-storing body 40 is formed in a linear asymmetric shape when viewed in the thickness direction of the substrate 10. For this reason, when the heat-storing body 40 is provided on the substrate 10, a worker or the like can easily distinguish between the front and back of the heat-storing body 40. As a result, even if the heat-storing body 40 has different shapes between the front and back, it is possible to improve the mountability of the heat-storing body 40 on the substrate 10.

Second Embodiment

Figure 7:
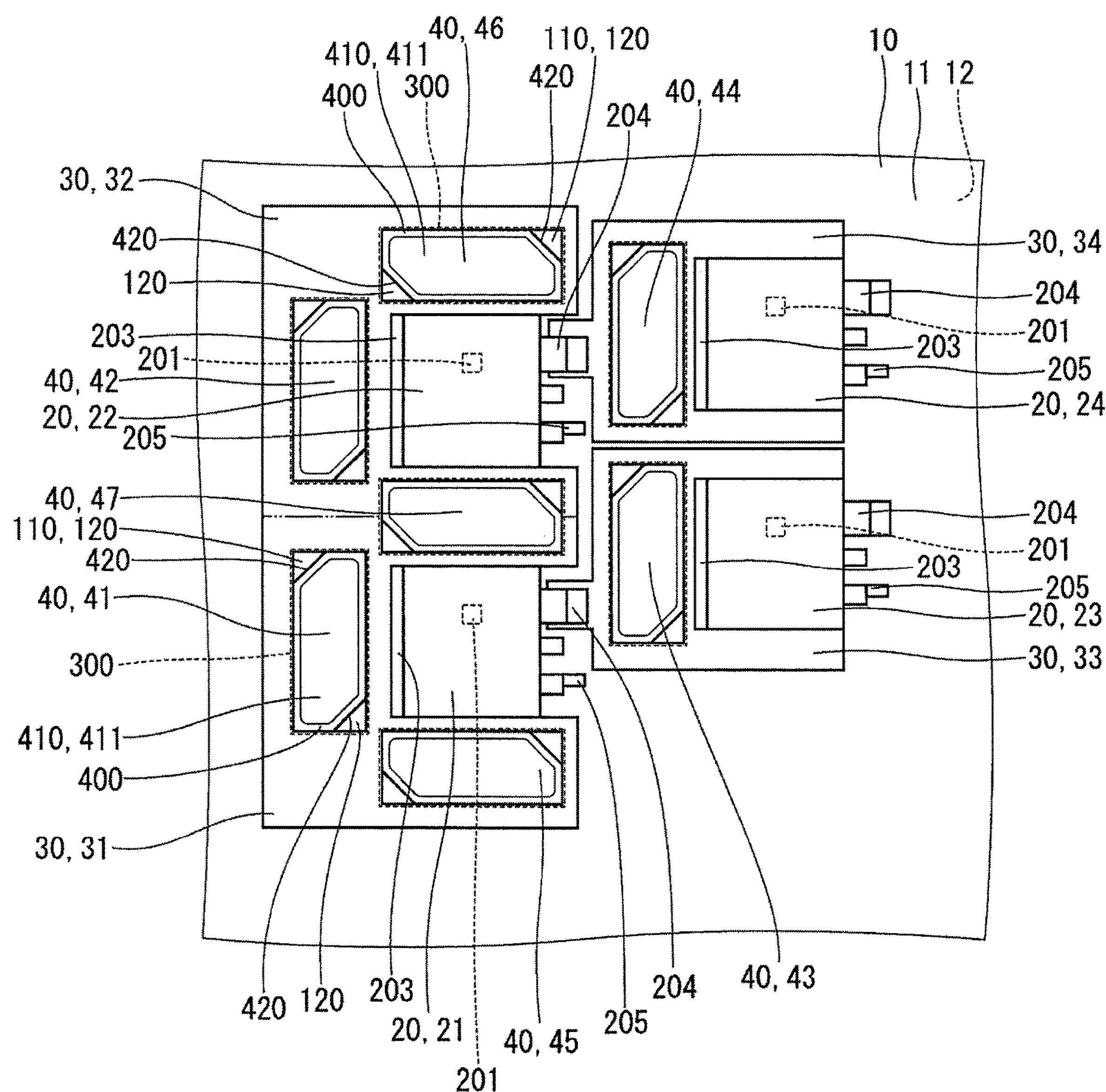
FIG. 7 is a schematic diagram showing the vicinity of heat-generating components of an electric power-steering control device according to a second embodiment.

An electric power-steering control device according to a second embodiment is partially shown in FIG. 7. In the second embodiment, the shape of each heat-storing body 40 is different from that in the first embodiment.

In the second embodiment, a notch section 420 is formed in each of two corners of the four corners of the main body 410 when viewed in the thickness direction of the substrate 10, the two corners being at diagonal positions. That is, two notch sections 420 are formed in one heat-storing body 40. The notch sections 420 are formed such that two corners of the four corners of each main body 410, the two corners being at diagonal positions, are cut off. The heat-storing body 40 is formed in a shape that is linear asymmetric and point symmetric when viewed in the thickness direction of the substrate 10.

In the present embodiment, when the heat-storing body 40 is mounted with a solder part 110, fillets 120 are formed on the portions of the mount area 300, the portions corresponding to the two notch sections 420 of the heat-storing body 40.

The second embodiment is the same as the first embodiment except the configuration mentioned above.

As described above, in the present embodiment, the notch section 420 is formed in each of the two corners of the main body 410, the two corners being at the diagonal positions when the main body 410 is viewed in the thickness direction, of the four corners of the main body 410. The heat-storing body 40 has a shape that is linear asymmetric and point symmetric when viewed in the thickness direction of the substrate 10. For this reason, when the heat-storing body 40 is mounted on the substrate 10, a worker or the like can easily distinguish between the front and back of the heat-storing body 40.

In addition, when the heat-storing body 40 is mounted with a solder part 110, it is possible to highly accurately check a mounting state of the heat-storing body 40 by seeing the fillets 120 formed on the portions of the mount area 300, the portions corresponding to two corners at the diagonal positions of the main body 410 of the heat-storing body 40.

Third Embodiment

Figure 8A:
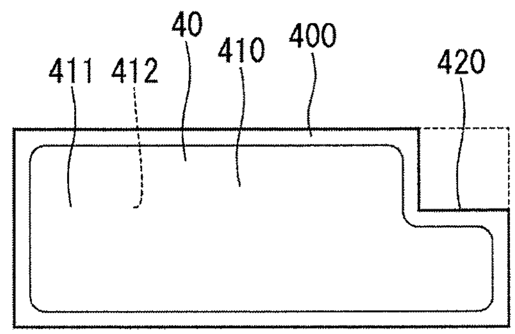
FIG. 8A is a plan view showing a heat-storing body of an electric power-steering control device according to a third embodiment.

A heat-storing body of an electric power-steering control device according to a third embodiment is shown in FIG. 8A. In the third embodiment, the shape of the heat-storing body 40 is different from that in the first embodiment.

FIG. 8A is a diagram showing the heat-storing body 40 of the third embodiment when viewed in the thickness direction of the main body 410, in other words, in the thickness direction of the substrate 10. In the third embodiment, the notch section 420 is formed in one corner of the four corners of the main body 410 when viewed in the thickness direction of the substrate 10. Specifically, the notch section 420 is formed such that one corner of the four corners of the main body 410 is notched. The heat-storing body 40 is formed in a linear asymmetric shape when viewed in the thickness direction of the substrate 10. In the present embodiment, the notch section 420 is formed such that the notch section 420 looks rectangular when viewed in the thickness direction of the substrate 10.

Also in the third embodiment, similarly to the first embodiment, the notch section 420 is formed in the corner of the four corners of the main body 410, the corner being located furthest from the semiconductor module 20 when viewed in the thickness direction of the substrate 10.

Fourth Embodiment

Figure 8B:
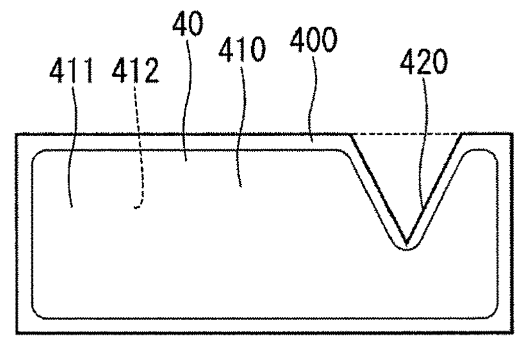
FIG. 8B is a plan view showing a heat-storing body of an electric power-steering control device according to a fourth embodiment.

A heat-storing body of an electric power-steering control device according to a fourth embodiment is shown in FIG. 8B. In the fourth embodiment, the shape of the heat-storing body 40 is different from that in the first embodiment.

FIG. 8B is a diagram showing the heat-storing body 40 of the fourth embodiment when viewed in the thickness direction of the main body 410, in other words, in the thickness direction of the substrate 10. In the fourth embodiment, the notch section 420 is formed in one side of the four sides of the main body 410 when viewed in the thickness direction of the substrate 10. Specifically, the notch section 420 is formed such that one side of the four sides of the main body 410 is notched. The heat-storing body 40 has a linear asymmetric shape when viewed in the thickness direction of the substrate 10. In the present embodiment, the notch section 420 is formed such that the notch section 42 looks triangular when viewed in the thickness direction of the substrate 10.

In addition, in the fourth embodiment, the notch section 420 is formed in the side of the four sides of the main body 410, the side being located furthest from the semiconductor module 20 when viewed in the thickness direction of the substrate 10.

As described above, in the present embodiment, the notch section 420 is formed in one of the four sides of the main body 410 when viewed in the thickness direction of the substrate 10. When the heat-storing body 40 is mounted with a solder part 110, a fillet 120 is formed on the portion of the mount area 300, the portion corresponding to the notch section 420 of the heat-storing body 40. By seeing the fillet 120, a worker or the like can confirm that a part of the heat-storing body 40, in particular, the portion in the vicinity of the notch section 420, in other words, the portion in the vicinity of the side of the main body 410 is normally connected to the substrate 10.

In addition, in the present embodiment, the notch section 420 is formed in one of the four sides of the main body 410, the one being located furthest from the semiconductor module 20 when viewed in the thickness direction of the substrate 10. For this reason, it is possible to suppress the decrease in heat conduction performance from the semiconductor modules 20 to the heat-storing bodies 40. In addition, when the heat-storing body 40 is mounted with a solder part 110, a worker or the like can easily see the fillet 120, so that it is possible to well check the mounting state of the heat-storing body 40.

Fifth Embodiment

Figure 8C:
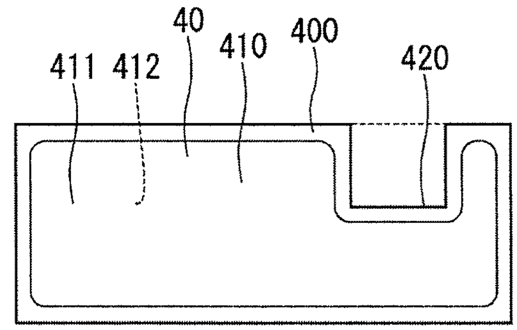
FIG. 8C is a plan view showing a heat-storing body of an electric power-steering control device according to a fifth embodiment.

A heat-storing body of an electric power-steering control device according to a fifth embodiment is shown in FIG. 8C. In the fifth embodiment, the shape of the heat-storing body 40 is different from that in the fourth embodiment.

In the fifth embodiment, the notch section 420 is formed such that the notch section 420 looks rectangular when viewed in the thickness direction of the substrate 10.

Sixth Embodiment

Figure 8D:
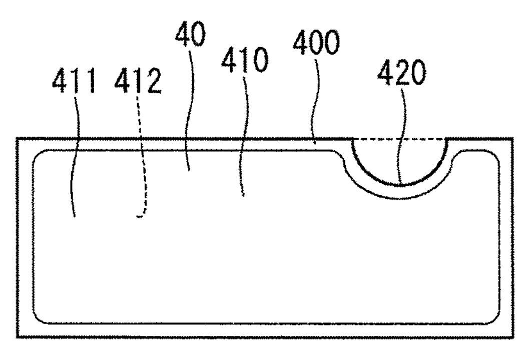
FIG. 8D is a plan view showing a heat-storing body of an electric power-steering control device according to a sixth embodiment.

A heat-storing body of an electric power-steering control device according to a sixth embodiment is shown in FIG. 8D. In the sixth embodiment, the shape of the heat-storing body 40 is different from that in the fourth embodiment.

In the sixth embodiment, the notch section 420 is formed such that the notch section 42 looks semicircular when viewed in the thickness direction of the substrate 10. In the sixth embodiment, it is relatively easy to form the heat-storing body 40 by press working. Alternatively, the notch section 420 can be easily formed by cutting, for example.

Seventh Embodiment

Figure 9A:
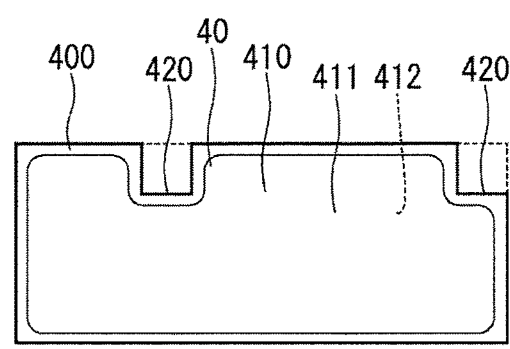
FIG. 9A is a plan view showing a heat-storing body of an electric power-steering control device according to a seventh embodiment.

A heat-storing body of an electric power-steering control device according to a seventh embodiment is shown in FIG. 9A. In the seventh embodiment, the shape of the heat-storing body 40 is different from that in the third embodiment.

FIG. 9A is a diagram showing the heat-storing body 40 of the seventh embodiment when viewed in the thickness direction of the main body 410, in other words, in the thickness direction of the substrate 10. In the seventh embodiment, a notch section 420 is formed in one corner of the four corners, when viewed in the thickness direction of the substrate 10. Also, a notch section 420 is formed in one of the four sides of the main body 410, when viewed in the thickness direction of the substrate 10. Specifically, the notch sections 420 are formed such that one corner of the four corners and one side of the four sides of the main body 410 are notched.

More specifically, the notch sections 420 are each formed in one corner of the four corners of the main body 410 and in the side connecting to the corner (see FIG. 9A). The heat-storing body 40 is formed in a linear asymmetric shape when viewed in the thickness direction of the substrate 10. In the present embodiment, the notch sections 420 are formed such that each of the notch section 420 looks rectangular when viewed in the thickness direction of the substrate 10.

In the seventh embodiment, one notch section 420 is formed in the corner of the four corners of the main body 410, the corner being located furthest from the semiconductor module 20 when viewed in the thickness direction of the substrate 10, and one notch section 420 is formed in the side of the four sides, the side being located furthest from the semiconductor module 20.

In the seventh embodiment, when the heat-storing body 40 is mounted with a solder part 110, a worker or the like can confirm that a portion in the vicinity of the heat-storing body 40, in particular, the portions in the vicinities of the notch sections 420, in other words, the portion in the vicinity of the corner of the main body 410 and the portion of the vicinity of the side are normally connected to the substrate 10, by seeing the fillets 120 formed on the notch sections 420.

Eighth Embodiment

Figure 9B:
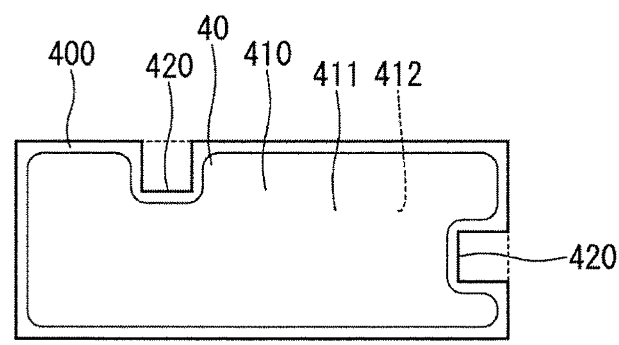
FIG. 9B is a plan view showing a heat-storing body of an electric power-steering control device according to an eighth embodiment.

A heat-storing body of an electric power-steering control device according to an eighth embodiment is shown in FIG. 9B. In the eighth embodiment, the shape of the heat-storing body 40 is different from that in the seventh embodiment.

FIG. 9B is a diagram showing the heat-storing body 40 of the eighth embodiment when viewed in the thickness direction of the main body 410, in other words, in the thickness direction of the substrate 10. In the eighth embodiment, notch sections 420 are formed such that one is in one side of the four sides of the main body 410, and another is in another side of the four sides of the main body 410, when viewed in the thickness direction of the substrate 10. Specifically, the notch sections 420 are formed such that two sides of the four sides of the main body 410 are notched.

More specifically, the notch sections 420 are formed such that the one is in a long side and another is in a short side, of the four sides of the main body 410 when viewed in the thickness direction of the substrate 10 (see FIG. 9B). The heat-storing body 40 has a linear asymmetric shape when viewed in the thickness direction of the substrate 10.

In the eighth embodiment, the notch sections 420 are formed such that one is in the side of the four sides of the main body 410, the side being located furthest from the semiconductor module 20 when viewed in the thickness direction of the substrate 10, and another is in a side adjacent to the furthest side.

In the eighth embodiment, when a heat-storing body 40 is mounted with a solder part 110, a worker or the like can confirm that a portion in the vicinity of the heat-storing body 40, in particular, the portions in the vicinities of the notch sections 420, in other words, the portions in the vicinities of the two sides of the main body 410 are normally connected to the substrate 10, by seeing the fillets 120 formed on the notch sections 420.

As described above, in the present embodiment, the notch sections 420 are formed in two sides of the four sides of the main body 410 when viewed in the thickness direction of the substrate 10. Therefore, when the heat-storing body 40 is mounted with a solder part 110, a worker or the like can confirm that a portion in the vicinity of the heat-storing body 40, in particular, the portions in the vicinities of the notch sections 420, in other words, the portions in the vicinities of the two sides of the main body 410 are normally connected to the substrate 10, by seeing the fillets 120 formed on the notch sections 420.

Ninth Embodiment

Figure 9C:
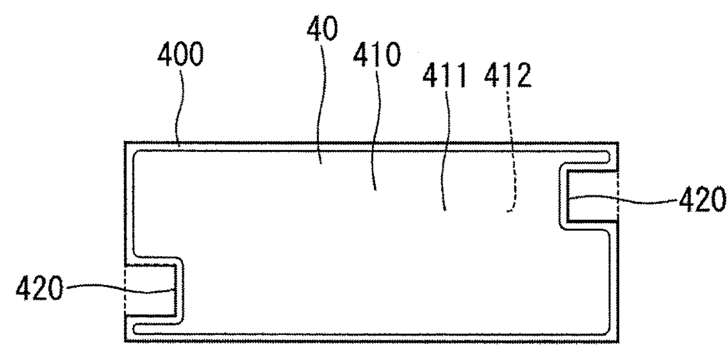
FIG. 9C is a plan view showing a heat-storing body of an electric power-steering control device according to a ninth embodiment.

A heat-storing body of an electric power-steering control device according to a ninth embodiment is shown in FIG. 9C. In the ninth embodiment, the shape of the heat-storing body 40 is different from that in the eighth embodiment.

In the ninth embodiment, notch sections 420 are formed such that one is in one of short sides of the four sides of the main body 410, and another is in another one of short sides of the four sides, when viewed in the thickness direction of the substrate 10 (see FIG. 9C). In the present embodiment, the heat-storing body 40 has a linear asymmetric and point symmetric shape when viewed in the thickness direction of the substrate 10.

In the ninth embodiment, when the heat-storing body 40 is mounted with a solder part 110, a worker or the like can confirm that a portion in the vicinity of the heat-storing body 40, in particular, the portions in the vicinities of the notch sections 420, in other words, the portions in the vicinities of the two short sides of the main body 410 are normally connected to the substrate 10, by seeing the fillets 120 formed on the notch sections 420.

Tenth Embodiment

Figure 9D:
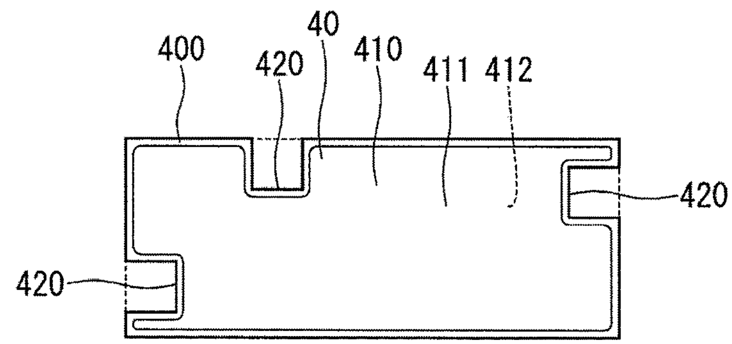
FIG. 9D is a plan view showing a heat-storing body of an electric power-steering control device according to a tenth embodiment.

A heat-storing body of an electric power-steering control device according to a tenth embodiment is shown in FIG. 9D. In the tenth embodiment, the shape of the heat-storing body 40 is different from that in the ninth embodiment.

In the tenth embodiment, notch sections 420 are formed such that one is in each of two short sides of the four sides of the main body 410, and another one is in one long side of the four sides of the main body 410, when viewed in the thickness direction of the substrate 10 (see FIG. 9D). In the present embodiment, the heat-storing body 40 has a linear asymmetric shape when viewed in the thickness direction of the substrate 10.

In the tenth embodiment, when the heat-storing body 40 is mounted with a solder part 110, a worker or the like can confirm that a portion in the vicinity of the heat-storing body 40, in particular, the portions in the vicinities of the notch sections 420, in other words, the portions in the vicinities of the two short sides and the portion in the vicinity of one long side of the main body 410 are normally connected to the substrate 10, by seeing the fillets 120 formed on the notch sections 420.

Eleventh Embodiment

Figure 10A:
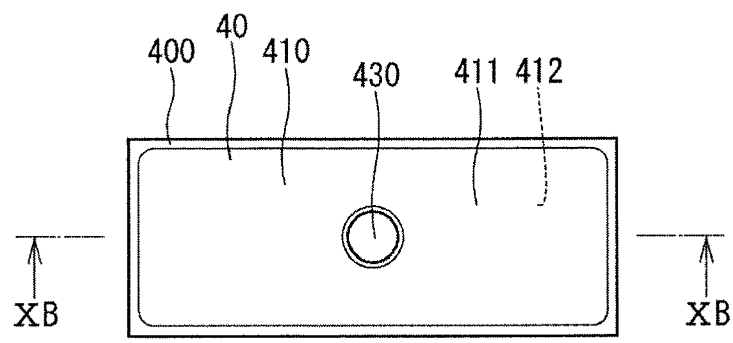
FIG. 10A is a plan view showing a heat-storing body of an electric power-steering control device according to an eleventh embodiment.
Figure 10B:
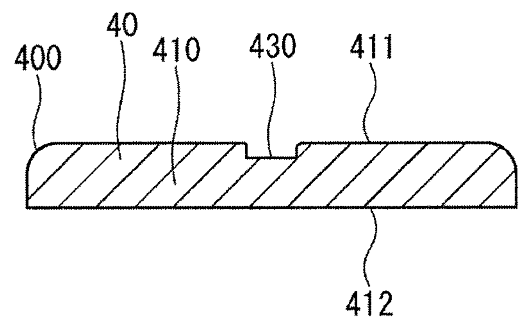
FIG. 10B is a cross-sectional view taken along line XB-XB of FIG. 10A.

A heat-storing body of an electric power-steering control device according to an eleventh embodiment is shown in FIGS. 10A and 10B. In the eleventh embodiment, the shape of the heat-storing body 40 is different from that in the first embodiment.

FIG. 10A is a diagram showing the heat-storing body 40 of the eleventh embodiment when viewed in the thickness direction of the main body 410, in other words, in the thickness direction of the substrate 10. In the eleventh embodiment, the heat-storing body 40 has a recess 430 instead of the notch section 420.

The recess 430 is formed to be recessed from the front surface 411, which is the surface on the side of the main body 410 of the heat-storing body 40 opposite to the substrate 10, toward the substrate 10 (see FIG. 10B). In the present embodiment, the recess 430 is formed in a circular shape and in the center of the front surface 411 of the main body 410. The recess 430 is formed by, for example, pressing a tool having a circular shape against the center of the front surface 411 of the main body 410.

The eleventh embodiment is the same as the first embodiment except the above-mentioned point.

As described above, the present embodiment is directed to an electronic control unit 1 that includes a control unit 60 to control a motor 101 capable of outputting assistive torque to assist steering by a driver, and the electronic control unit 1 includes a substrate 10, a semiconductor module 20, and a heat-storing body 40.

The semiconductor module 20 is provided on one surface 11 of the substrate 10 and generates heat when operating.

The heat-storing body 40 has a main body 410 having a rectangular plate shape provided on the one surface 11 of the substrate 10 and has a recess 430 formed to be recessed from the surface (front surface 411) on the side of the main body 410 opposite to the substrate 10, and can store the heat from the semiconductor module 20. Since the heat-storing body 40 stores the heat from the semiconductor module 20, it is possible to suppress a temperature rise of the semiconductor module 20.

In the present embodiment, the heat-storing body 40 has the recess 430 formed to be recessed from the front surface 411, which is on the side of the main body 410 opposite to the substrate 10. For this reason, when the heat-storing body 40 is mounted on the substrate 10, a worker or the like can easily distinguish between the front and back of the heat-storing body 40. As a result, even if the heat-storing body 40 has different shapes between the front and back, it is possible to improve the mountability of the heat-storing body 40 on the substrate 10.

In addition, an electronic control unit 1 of the present embodiment includes a substrate 10, a semiconductor module 20, and a heat-storing body 40.

The heat-storing body 40 has a main body 410 having a rectangular plate shape provided on the one surface 11 of the substrate 10 and has a recess 430 formed to be recessed from the surface (front surface 411) on the side of the main body 410 opposite to the substrate 10, and can store the heat from the semiconductor module 20. For this reason, when the heat-storing body 40 is provided on the substrate 10, a worker or the like can easily distinguish between the front and back of the heat-storing body 40. As a result, even if the heat-storing body 40 has different shapes between the front and back, it is possible to improve the mountability of the heat-storing body 40 on the substrate 10.

In the electronic control unit 1 of the present embodiment, since the mountability of the heat-storing bodies 40, which are capable of suppressing the temperature rises of the semiconductor modules 20, is high, the electronic control unit 1 is suitable as a control device for an electric power-steering device 100 in which a large current flows and thus generates a large amount of heat.

In the eleventh embodiment, the recess 430 is formed at the center of the front surface 411 of the main body 410. Therefore, when the heat-storing body 40 is mounted in the vicinity of the semiconductor module 20, it is possible to suppress variation, in the heat conduction performance from the semiconductor module 20 to the heat-storing body 40, depending on positions on the main body 410.

Twelfth Embodiment

Figure 10C:
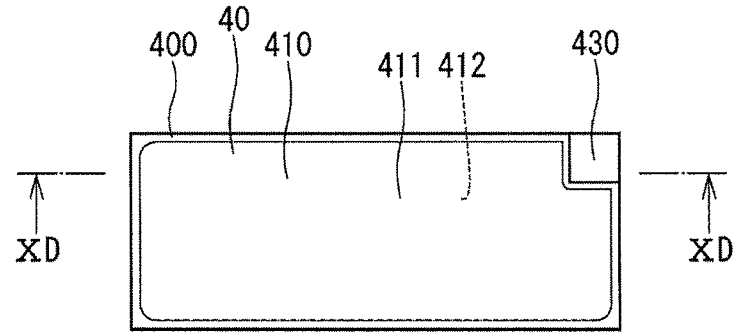
FIG. 10C is a plan view showing a heat-storing body of an electric power-steering control device according to a twelfth embodiment.
Figure 10D:
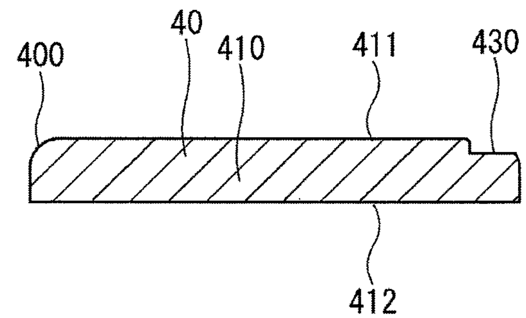
FIG. 10D is a cross-sectional view taken along line XD-XD of FIG. 10C.

A heat-storing body of an electric power-steering control device according to a twelfth embodiment is shown in FIGS. 10C and 10D. In the twelfth embodiment, the shape of the heat-storing body 40 is different from that in the eleventh embodiment.

In the twelfth embodiment, the recess 430 is formed in a rectangular shape in one corner of the four corners of the main body 410 when viewed in the thickness direction of the substrate 10 (see FIG. 10C). In the present embodiment, the heat-storing body 40 has a linear asymmetric shape when viewed in the thickness direction of the substrate 10. The recess 430 is formed by, for example, pressing a tool having a rectangular shape against the corner of the front surface 411 of the main body 410.

In the twelfth embodiment, the recess 430 is formed in the corner of the four corners of the main body 410, the corner being located furthest from the semiconductor module 20 when viewed in the thickness direction of the substrate 10.

The twelfth embodiment is the same as the eleventh embodiment except the above-mentioned point.

As described above, in the present embodiment, the heat-storing body 40 has a linear asymmetric shape when viewed in the thickness direction of the substrate 10. For this reason, it is easy to distinguish between the front and back of the heat-storing body 40.

In addition, in the present embodiment, the recess 430 is formed in the corner of the four corners of the main body 410, the corner being located furthest from the semiconductor module 20 when viewed in the thickness direction of the substrate 10. For this reason, it is possible to suppress the decrease in heat conduction performance from the semiconductor modules 20 to the heat-storing bodies 40.

Other Embodiments

In another embodiment of the present disclosure, it is possible to provide any number of heat-storing bodies 40 for one semiconductor module 20 (heat-generating component). In addition, it is possible to provide any number of semiconductor modules 20 for one substrate 10. In this case, the semiconductor modules 20 may be disposed on the substrate 10 in any arrangement.

In another embodiment of the present disclosure, a heat-storing body 40 may be mounted on the substrate 10 not only with solder but also with adhesive agents, for example. In this case, solder does not have to be used to mount the heat-storing body 40 on the substrate 10.

In the example shown in the above-mentioned embodiments, the heat-storing bodies 40 are formed by press working. In contrast, in another embodiment of the present disclosure, for example, after a main body 410 of a heat-storing body 40 is formed in a rectangular shape by press working, a notch section 420 may be formed by notching a part of the outer edge of the main body 410. Alternatively, for example, after a main body 410 of a heat-storing body 40 is formed in a rectangular shape by press working, a notch section 420 may be formed by cutting.

In the example shown in the above-mentioned embodiment, the main body 410 of the heat-storing body 40 is formed such that the outer edges of the corners on the side of the main body 410 opposite to the substrate 10 have a curved line shape in the cross-section in the thickness direction of the substrate 10. In contrast, in another embodiment of the present disclosure, a main body 410 of a heat-storing body 40 may be formed such that the outer edges of the corners on the side of the main body 410 opposite to the substrate 10 have a straight line shape in the cross-section in the thickness direction of the substrate 10. In the case where a main body 410 of a heat-storing body 40 is formed in a method other than press working, the outer edges of the corners on the side of the main body 410 of the heat-storing body 40 opposite to the substrate 10 can have a straight line shape in the cross-section in the thickness direction of the substrate 10.

In another embodiment of the present disclosure, any material such as carbon may be used to form a heat-storing body 40 as long as the material has a thermal conductivity equal to or higher than a predetermined value. The heat-storing body 40 does not have to be formed of electrically conductive material and may be formed of an insulating material such as aluminum nitride or silicon nitride. In the present disclosure, whatever material is used to form the heat-storing body 40, it is easy to distinguish between the front and back of the heat-storing body 40. The heat-storing body 40 does not have to be in contact with the printed wiring 30 of the substrate 10. The heat-storing body 40 may be in contact with the semiconductor module 20. The heat-storing body 40 does not have to be plated.

In the examples described in the above-mentioned embodiments, assumed that the length of the side of the sealing body 202 of the semiconductor module 20 in the longitudinal direction is L, a plurality of heat-storing bodies 40 are provided within the boundary R1 that is away from the outer edges of the sealing body 202 of the semiconductor module 20 by a predetermined distance L. In contrast, in another embodiment of the present disclosure, a plurality of heat-storing bodies 40 may be provided with a part of the heat-storing bodies 40 disposed outside the boundary R1. The heat-storing body 40 does not have to be provided within the boundary R1. However, in order for heat to be effectively conducted from the semiconductor module 20 to the heat-storing body 40, the heat-storing body 40 is preferably disposed in the vicinity of the semiconductor module 20. The sealing body 202 of the semiconductor module 20 does not have to be rectangular and may be formed in any shape such as a polygonal shape or a circular shape.

In another embodiment of the present disclosure, the heat conduction member may be a heat dissipation sheet having a sheet shape in which silicone is used as a base material and which has a low thermal resistance. In another embodiment of the present disclosure, a heat conduction member does not have to be provided.

In the examples described in the above-mentioned embodiments, the distance between each heat-generating component and the heat dissipation body is set smaller than the distance between each heat-storing body 40 and the heat dissipation body. In contrast, in another embodiment of the present disclosure, the distance between each heat-generating component and the heat dissipation body may be set equal to or less than the distance between each heat-storing body 40 and the heat dissipation body. In another embodiment of the present disclosure, the distance between each heat-generating component and the heat dissipation body may be arbitrarily set regardless of the distance between each heat-storing body 40 and the heat dissipation body. However, if the heat-storing body 40 is formed of electrically conductive material, the distance between each heat-generating component and the heat dissipation body is preferably set less than the distance between each heat-storing body 40 and the heat dissipation body. In addition, the heat dissipation body does not have to be formed of aluminum and may be formed of material whose thermal conductivity is equal to or higher than a predetermined value, and examples of the material include iron, copper, aluminum nitride, and silicon nitride. In another embodiment of the present disclosure, the heat dissipation body does not have to be provided.

In another embodiment of the present disclosure, the sealing body of the heat-generating component does not have to be made of resin and may be formed of an insulating material such as aluminum nitride or silicon nitride. A part of the heat-generating element may be exposed from the sealing body.

An electronic unit according to the present disclosure may be used to control driving of not only an electric power-steering device but also electrically powered equipment such as motors on other devices.

As described above, the present disclosure is not limited to the above embodiments and can be practiced in various forms without departing from the gist of the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electric power-steering control device having a control unit that controls a motor configured to output assistive torque to assist steering by a driver, the electric power-steering control device comprising:

a substrate;

a heat-generating component that is provided on one surface of the substrate and generates heat during operation, the one surface being positioned between the substrate and the heat-generating component when viewed in a thickness direction of the substrate; and a heat-storing body that is configured to store the heat from the heat-generating component, the heat-storing body having:

a main body that has a rectangular plate shape and is provided on the one surface of the substrate; and a notch section that is formed into a notch shape at an outer edge of the main body when viewed in the thickness direction of the substrate, the notch section comprising a removed portion of the main body, wherein the notch section is located in one of four corners of the main body, the one being furthest from the heat-generating component, when viewed in the thickness direction of the substrate, and wherein the heat-storing body has a linear asymmetric shape, when viewed in the thickness direction of the substrate.

2. An electric power-steering control device having a control unit that controls a motor configured to output assistive torque to assist steering by a driver, the electric power-steering control device comprising:

a substrate;

a heat-generating component that is provided on one surface of the substrate and generates heat during operation, the one surface being positioned between the substrate and the heat-generating component when viewed in a thickness direction of the substrate; and a heat-storing body that is configured to store the heat from the heat-generating component, the heat-storing body having:

a main body that has a rectangular plate shape and is provided on the one surface of the substrate; and a notch section that is formed into a notch shape at an outer edge of the main body when viewed in the thickness direction of the substrate, the notch section comprising a removed portion of the main body, wherein the notch section is located in one of four sides of the main body, the one being furthest from the heat-generating component, when viewed in the thickness direction of the substrate, and wherein the heat-storing body has a linear asymmetric shape, when viewed in the thickness direction of the substrate.

3. An electric power-steering control device having a control unit that controls a motor configured to output assistive torque to assist steering by a driver, the electric power-steering control device comprising:

a substrate;

a heat-generating component that is provided on one surface of the substrate and generates heat during operation, the one surface being positioned between the substrate and the heat-generating component when viewed in a thickness direction of the substrate; and a heat-storing body that is configured to store the heat from the heat-generating component, the heat-storing body having:

a main body that has a rectangular plate shape and is provided on the one surface of the substrate; and a recess recessed from a surface of the main body, the surface being on a side opposite to the substrate, the recess comprising a recessed portion of the main body, wherein the recess is located in one of four corners of the main body, the one being furthest from the heat-generating component, when viewed in a-the thickness direction of the substrate.

4. The electric power-steering control device according to claim 3, wherein the heat-storing body has a linear asymmetric shape, when viewed in the thickness direction of the substrate.

5. The electric power-steering control device according to claim 1, further comprising:

a solder part connecting the substrate and the heat-storing body to each other.

6. The electric power-steering control device according to claim 1, wherein the substrate is provided with a mount area (300) having a shape corresponding to the shape of the main body.

7. The electric power-steering control device according to claim 1, wherein the main body has a cross sectional shape, defined in the thickness direction of the substrate, in which an outer edge of a corner of the main body on a side opposite to the substrate has a curved line shape.

8. An electronic unit comprising:

a substrate;

a heat-generating component that is provided on one surface of the substrate and generates heat during operation, the one surface being positioned between the substrate and the heat-generating component when viewed in a thickness direction of the substrate; and a heat-storing body that is configured to store the heat from the heat-generating component, the heat-storing body having:

a main body that has a rectangular plate shape and is provided on the one surface of the substrate; and a notch section that is formed into a notch shape at an outer edge of the main body when viewed in the thickness direction of the substrate, the notch section comprising a removed portion of the main body, wherein the notch section is located in one of four corners of the main body, the one being furthest from the heat-generating component, when viewed in the thickness direction of the substrate, and wherein the heat-storing body has a linear asymmetric shape, when viewed in the thickness direction of the substrate.

9. An electronic unit comprising:

a substrate;

a heat-generating component that is provided on one surface of the substrate and generates heat during operation, the one surface being positioned between the substrate and the heat-generating component when viewed in a thickness direction of the substrate; and a heat-storing body that is configured to store the heat from the heat-generating component, the heat-storing body having:

a main body that has a rectangular plate shape and is provided on the one surface of the substrate; and a notch section that is formed into a notch shape at an outer edge of the main body when viewed in the thickness direction of the substrate, the notch section comprising a removed portion of the main body, wherein the notch section is located in one of four sides of the main body, the one being furthest from the heat-generating component, when viewed in the thickness direction of the substrate, and wherein the heat-storing body has a linear asymmetric shape, when viewed in the thickness direction of the substrate.

10. An electronic unit comprising:

a substrate;

a heat-generating component that is provided on one surface of the substrate and generates heat during operation, the one surface being positioned between the substrate and the heat-generating component when viewed in a thickness direction of the substrate; and a heat-storing body that is configured to store the heat from the heat-generating component, the heat-storing body having:

a main body that has a rectangular plate shape and is provided on the one surface of the substrate; and a recess recessed from a surface of the main body, the surface being on a side opposite to the substrate, the recess comprising a recessed portion of the main body, wherein the recess is located in one of four corners of the main body, the one being furthest from the heat-generating component, when viewed in the thickness direction of the substrate.

11. An electric power-steering control device having a control unit that controls a motor configured to output assistive torque to assist steering by a driver, the electric power-steering control device comprising:

a substrate;

a heat-generating component that is provided on one surface of the substrate and generates heat during operation; and a heat-storing body that is configured to store the heat from the heat-generating component, the heat-storing body having:

a main body that has a rectangular plate shape and is provided on the one surface of the substrate; and a recess recessed from a surface of the main body, the surface being on a side opposite to the substrate, wherein the recess is located at a center of the main body, when viewed in a thickness direction of the substrate.

12. The electric power-steering control device according to claim 11, wherein the recess has a circular shape, when viewed in the thickness direction of the substrate.

13. An electronic unit comprising:

a substrate;

a heat-generating component that is provided on one surface of the substrate and generates heat during operation; and a heat-storing body that is configured to store the heat from the heat-generating component, the heat-storing body having:

a main body that has a rectangular plate shape and is provided on the one surface of the substrate; and a recess recessed from a surface of the main body, the surface being on a side opposite to the substrate, wherein the recess is located at a center of the main body, when viewed in a thickness direction of the substrate.

14. The electronic unit according to claim 13, wherein the recess has a circular shape, when viewed in the thickness direction of the substrate.

15. The electric power-steering control device according to claim 1, wherein the heat-generating component and the heat-storing body are both provided on the one surface of the substrate, and are arranged adjacent to each other in a planar direction of the substrate.

16. The electric power-steering control device according to claim 2, wherein the heat-generating component and the heat-storing body are both provided on the one surface of the substrate, and are arranged adjacent to each other in a planar direction of the substrate.

17. The electric power-steering control device according to claim 3, wherein the heat-generating component and the heat-storing body are both provided on the one surface of the substrate, and are arranged adjacent to each other in a planar direction of the substrate.

* * * * *